(12) United States Patent
Goh et al.

(10) Patent No.: US 11,929,295 B2
(45) Date of Patent: Mar. 12, 2024

(54) MULTI-USE PACKAGE ARCHITECTURE

(71) Applicant: Intel Corporation, Santa Clara, CA (US)

(72) Inventors: Eng Huat Goh, Ayer Itam (MY); Jiun Hann Sir, Gelugor (MY); Min Suet Lim, Bayan Lepas (MY); Richard C. Stamey, Portland, OR (US); Chu Aun Lim, Hillsboro, OR (US); Jimin Yao, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/677,843

(22) Filed: Feb. 22, 2022

(65) Prior Publication Data

US 2022/0181227 A1  Jun. 9, 2022

Related U.S. Application Data

(62) Division of application No. 15/925,429, filed on Mar. 19, 2018, now abandoned.

(51) Int. Cl.
*H01L 23/31* (2006.01)
*H01L 23/00* (2006.01)
(Continued)

(52) U.S. Cl.
CPC ...... *H01L 23/3121* (2013.01); *H01L 23/5283* (2013.01); *H01L 23/5389* (2013.01);
(Continued)

(58) Field of Classification Search
CPC ............ H01L 25/0652; H01L 23/3121; H01L 23/5385
See application file for complete search history.

(56) References Cited

U.S. PATENT DOCUMENTS 6,586,352 B1 * 7/2003 Blumberg .............. H05K 1/036
442/247
8,836,149 B2  9/2014 Son et al.
(Continued)

OTHER PUBLICATIONS

Final Office Action for U.S. Appl. No. 15/925,429, dated Nov. 23, 2021.
(Continued)

*Primary Examiner* — Vincent Wall
(74) *Attorney, Agent, or Firm* — Essential Patents Group, LLP

(57) ABSTRACT

A semiconductor package is disclosed, which comprises a substrate, one or more dies on a first side of the substrate, and a plurality of interconnect structures having a first pitch and coupled to a second side of the substrate. The interconnect structures may attach the substrate to a board. The substrate may include a first interconnect layer having a second pitch. The first interconnect layer may be coupled to the one or more dies through second one or more interconnect layers. Third one or more interconnect layers between the first interconnect layer and the interconnect structures may translate the first pitch to the second pitch. The substrate may include a recess on a section of the second side of the substrate. The semiconductor package may further include one or more components within the recess and attached to the second side of the substrate.

14 Claims, 19 Drawing Sheets

(51) Int. Cl.
*H01L 23/528* (2006.01)
*H01L 23/538* (2006.01)

(52) U.S. Cl.
CPC .............. *H01L 24/10* (2013.01); *H01L 24/82* (2013.01); *H01L 2924/01029* (2013.01); *H01L 2924/1811* (2013.01)

(56) References Cited

U.S. PATENT DOCUMENTS

| | | | |
|---|---|---|---|
| 9,953,959 B1* | 4/2018 | Darmawikarta | H01L 21/4857 |
| 10,332,862 B2* | 6/2019 | Chen | H01L 25/50 |
| 10,720,392 B2* | 7/2020 | Aoki | H01L 21/4853 |
| 11,107,700 B2* | 8/2021 | Suk | H01L 21/6835 |
| 11,152,309 B2* | 10/2021 | Suk | H01L 23/49838 |
| 2005/0202261 A1* | 9/2005 | Takai | H05K 3/4655 |
| | | | 428/209 |
| 2008/0079163 A1* | 4/2008 | Kurita | H01L 25/0657 |
| | | | 257/E23.141 |
| 2011/0024898 A1 | 2/2011 | Leung et al. | |
| 2013/0032390 A1* | 2/2013 | Hu | H01L 23/49833 |
| | | | 174/266 |
| 2013/0127025 A1* | 5/2013 | Cho | H01L 25/16 |
| | | | 257/E23.114 |
| 2013/0313727 A1* | 11/2013 | Goh | H01L 21/50 |
| | | | 438/109 |
| 2013/0335928 A1* | 12/2013 | Tseng | H05K 3/4682 |
| | | | 361/748 |
| 2015/0187692 A1* | 7/2015 | Tseng | H01L 23/49838 |
| | | | 174/250 |
| 2017/0170105 A1* | 6/2017 | Yao | H01L 23/3114 |
| 2017/0290156 A1 | 10/2017 | Sturcken et al. | |
| 2018/0145051 A1* | 5/2018 | Loo | H01L 25/50 |
| 2019/0057915 A1* | 2/2019 | Starkston | H01L 23/13 |
| 2019/0164912 A1* | 5/2019 | Lee | H01L 21/4857 |
| 2019/0164914 A1 | 5/2019 | Hu et al. | |

OTHER PUBLICATIONS

Office Action for U.S. Appl. No. 15/925,429, dated Jul. 13, 2021.
Restriction Requirement for U.S. Appl. No. 15/925,429, dated Apr. 22, 2021.

* cited by examiner

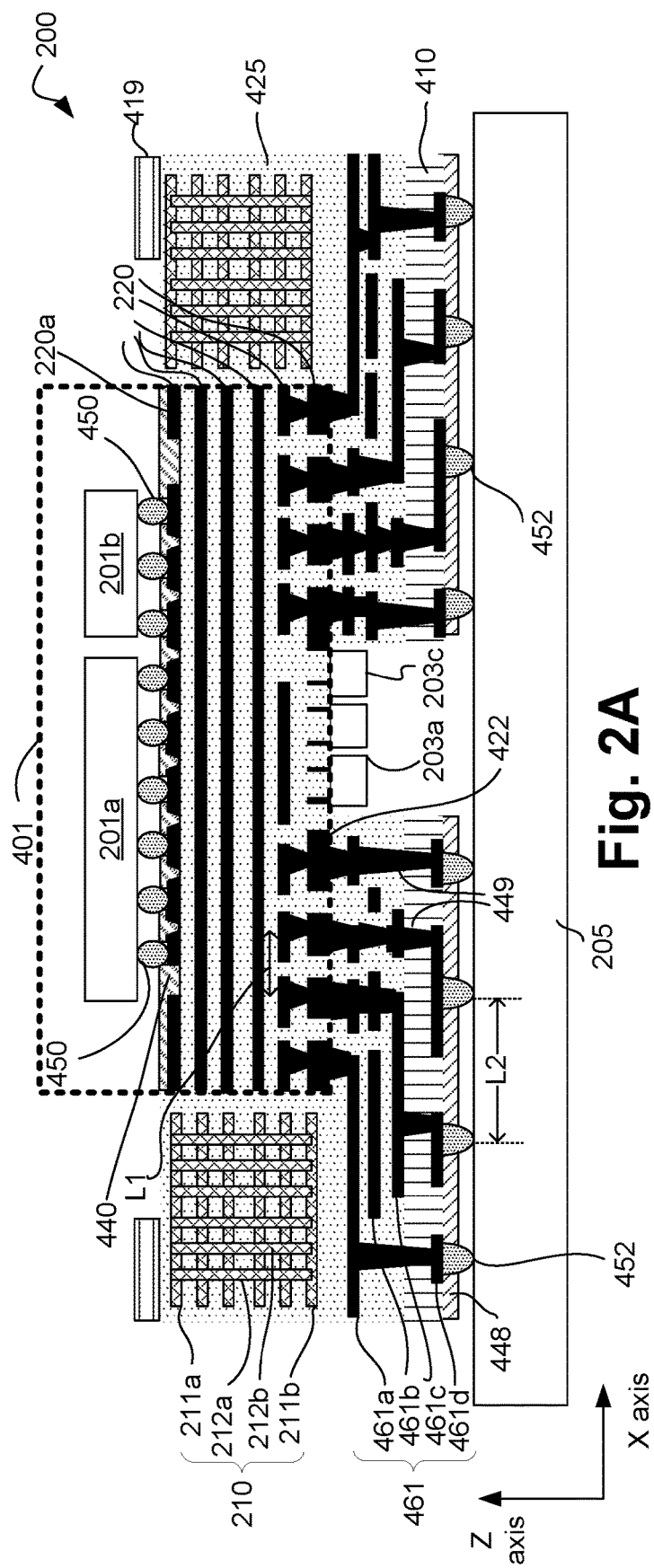
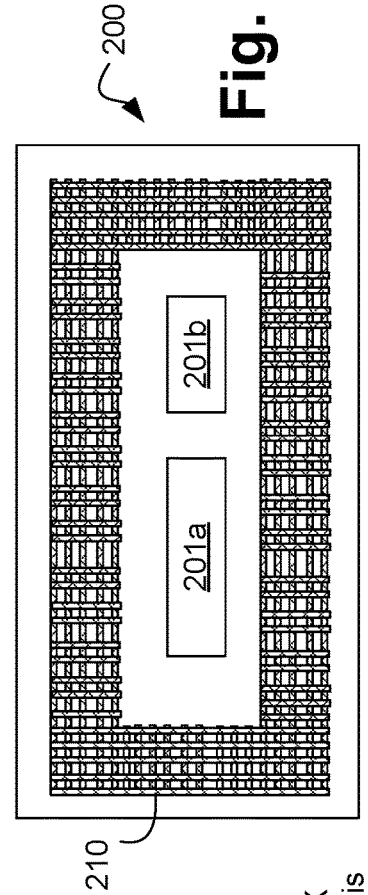
Fig. 2A
Fig. 2B

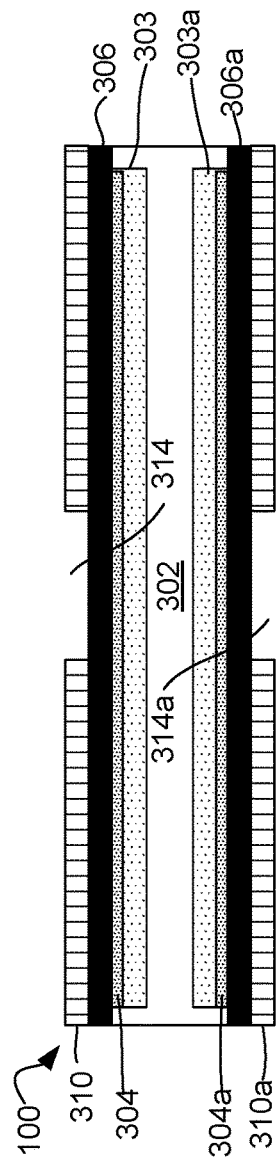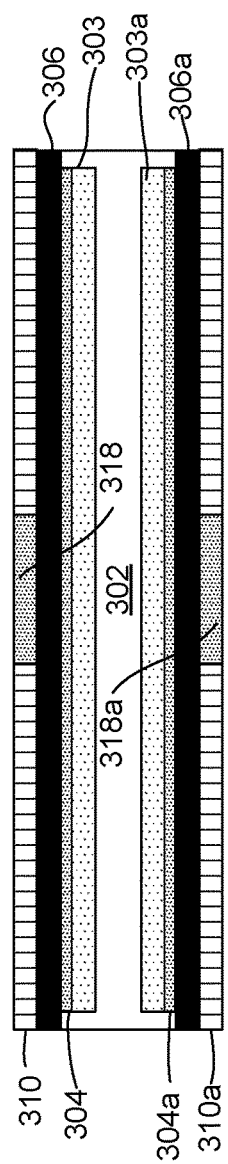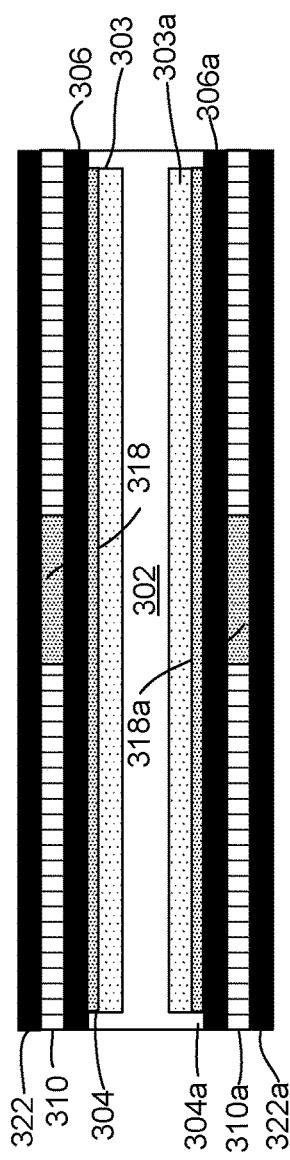

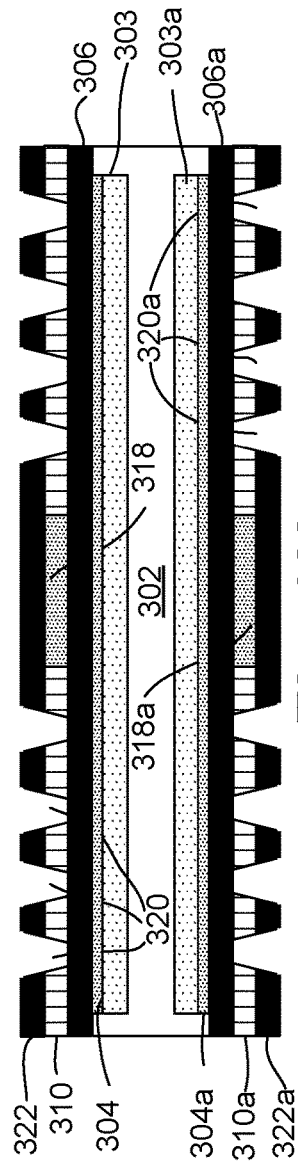
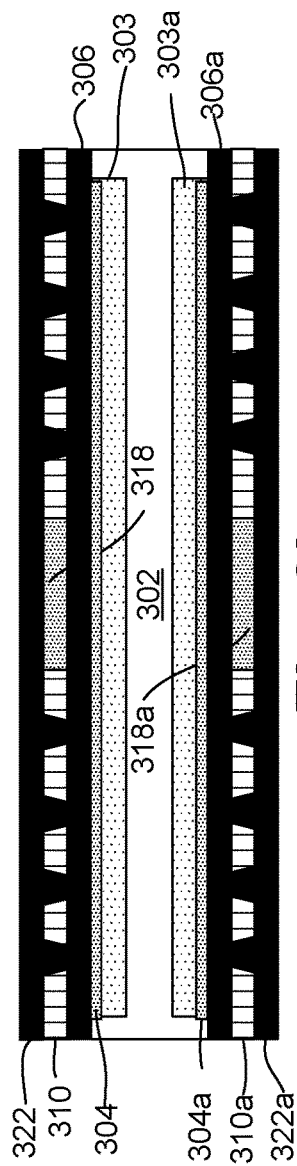
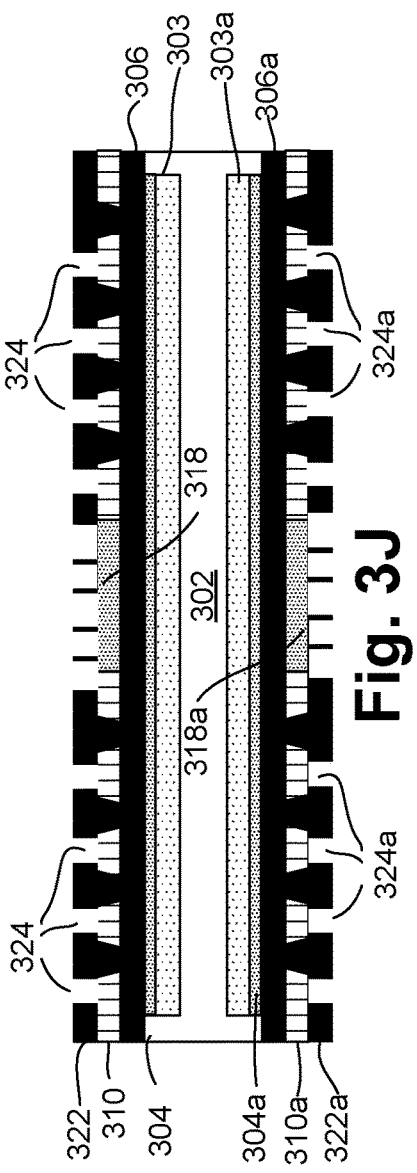

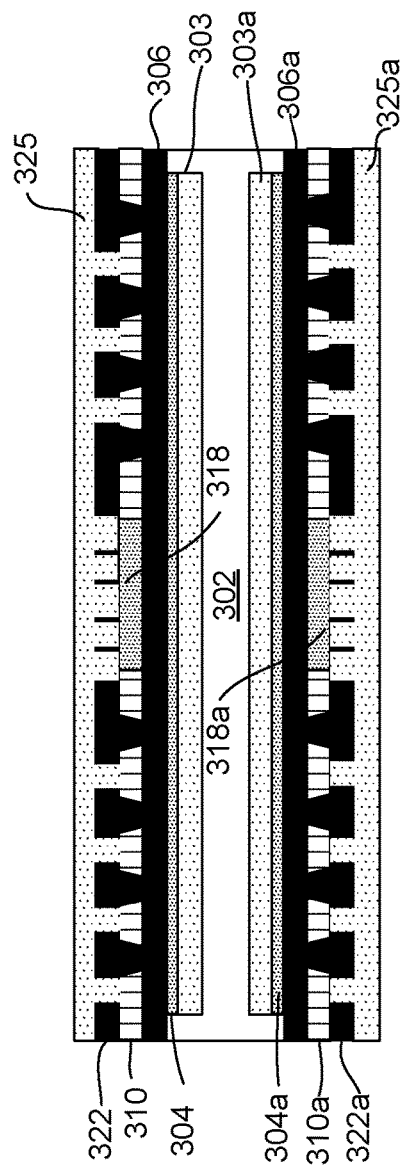
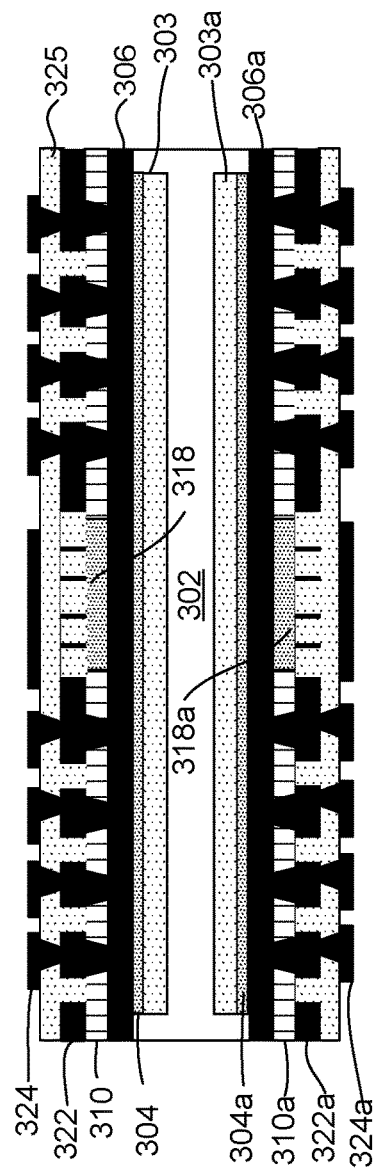

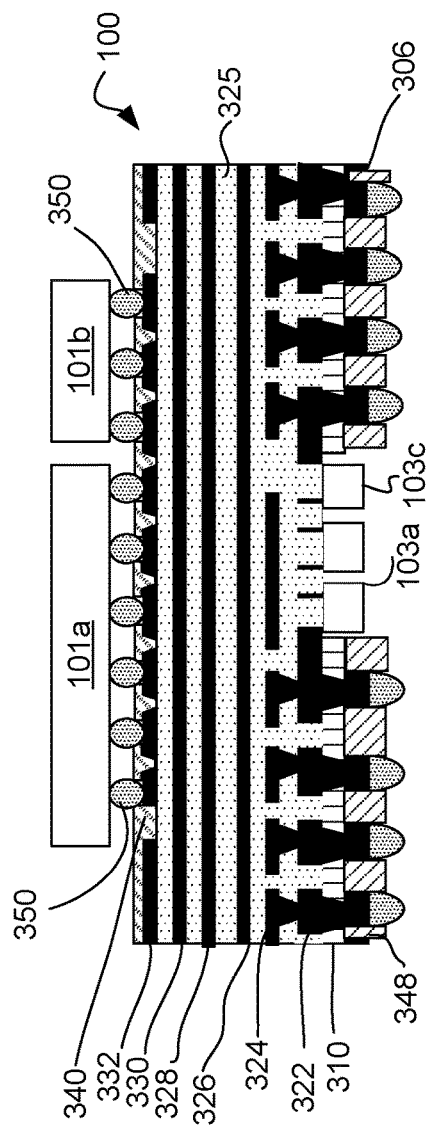
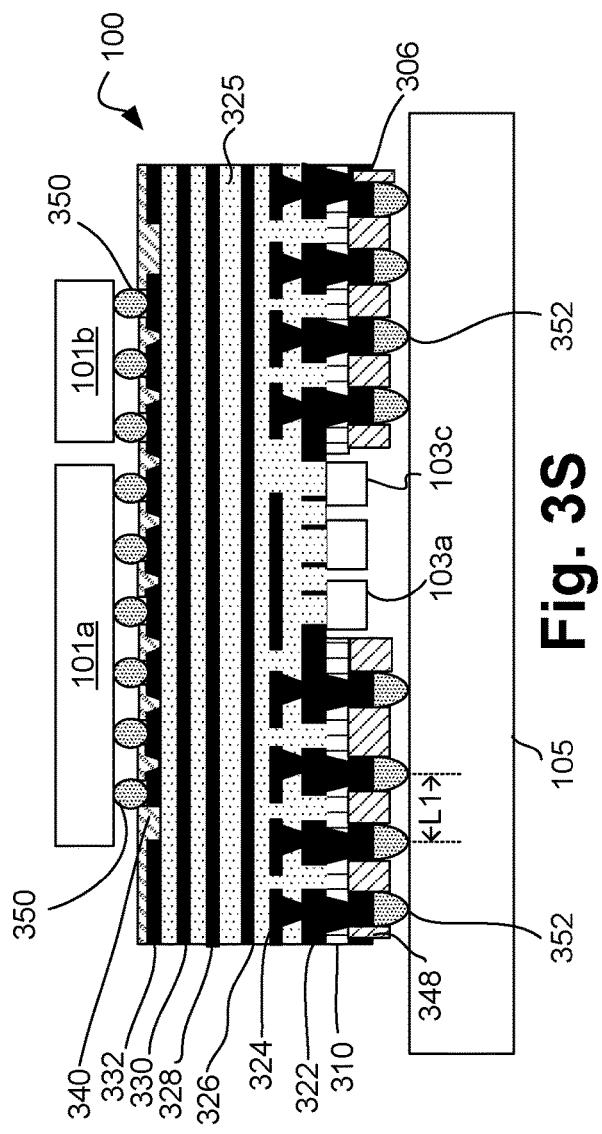

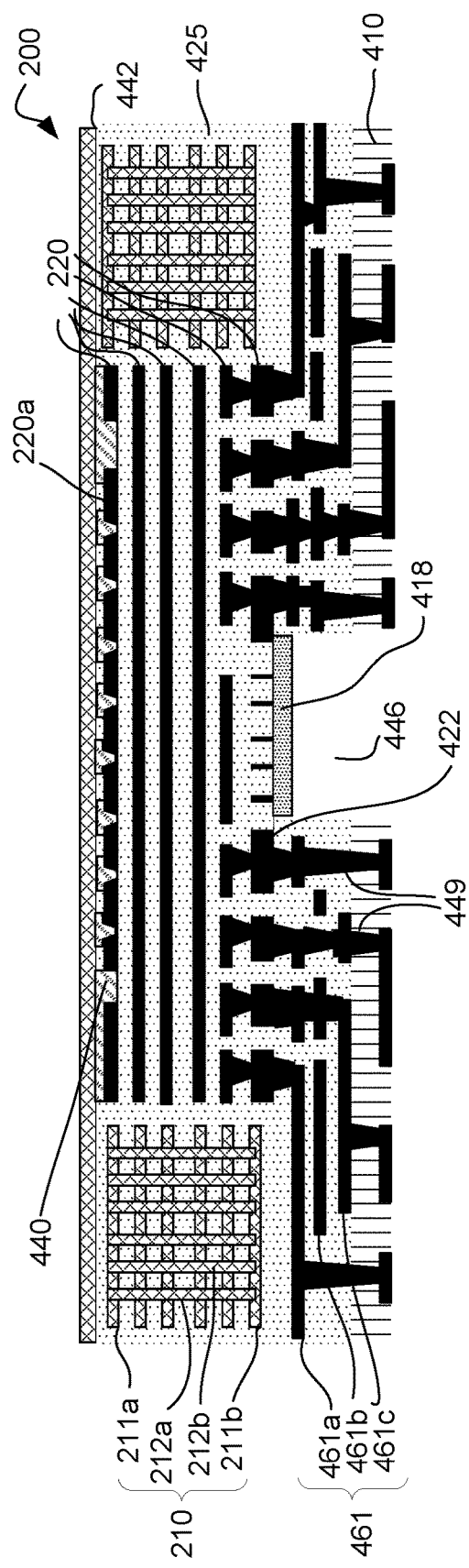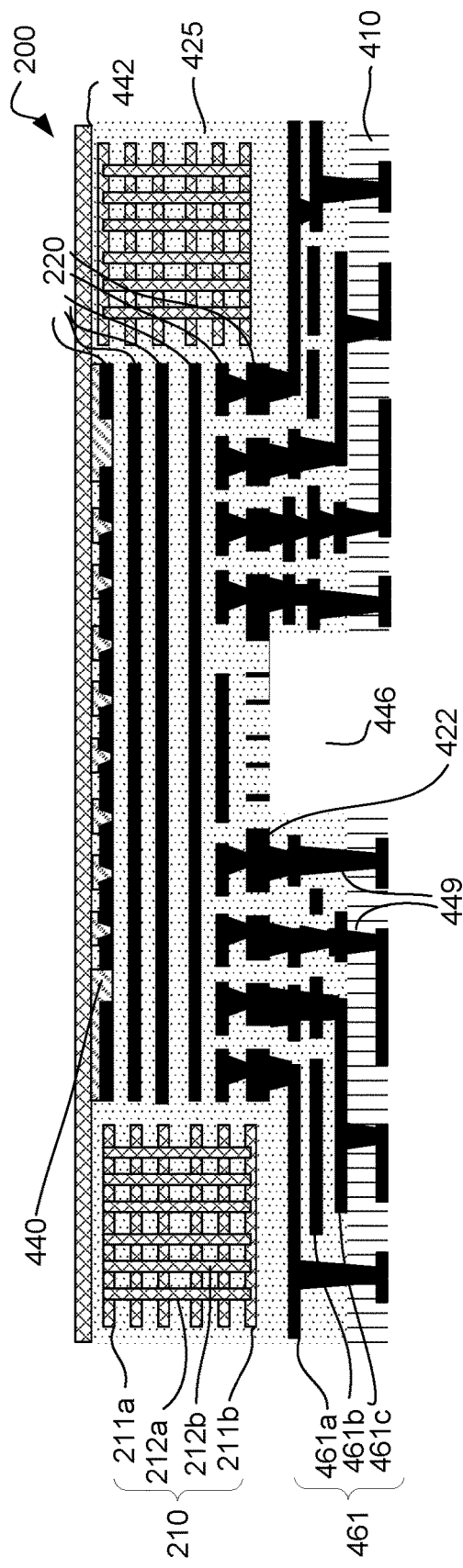

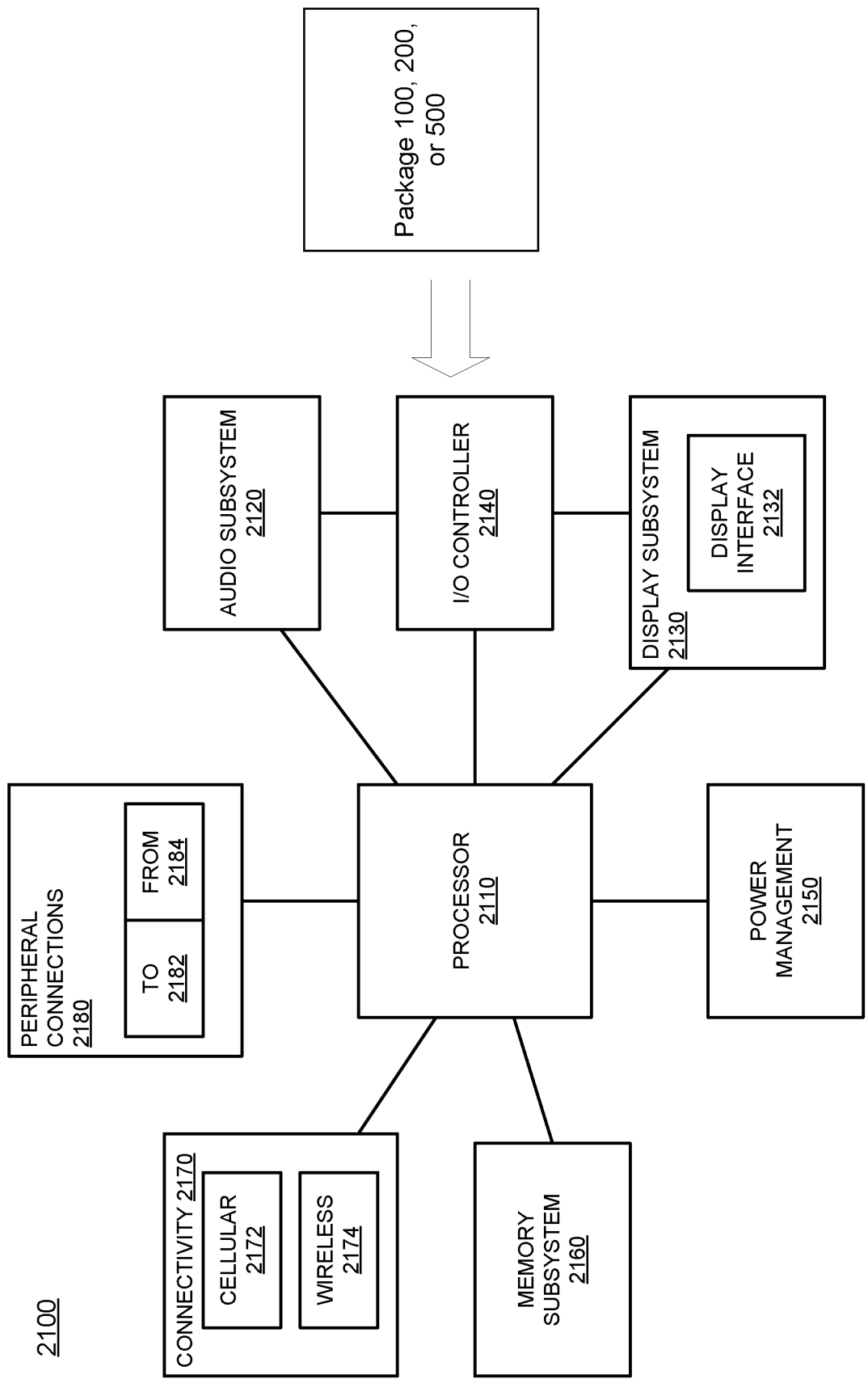

US 11,929,295 B2

MULTI-USE PACKAGE ARCHITECTURE

CLAIM FOR PRIORITY

This application is a divisional of, and claims priority to, U.S. patent application Ser. No. 15/925,429, filed on Mar. 19, 2018, titled "Multi-Use Package Architecture", which is incorporated by reference in its entirety for all purposes.

BACKGROUND

A semiconductor package may have a first pitch of interconnect structures. The semiconductor package may be attached to a motherboard or a Printed Circuit Board (PCB) having the first pitch of pads, e.g., corresponding to the first pitch of the interconnect structures of the semiconductor package. One difficulty is that the semiconductor package may not be readily attached to a board having pads disposed with a second pitch, e.g., if the second pitch is significantly different from the first pitch.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2A schematically illustrates a cross-sectional view of a semiconductor package with a relatively high pitch (e.g., pitch L2) for package interconnect structures, and with a recess in a substrate for coupling one or more LSCs, wherein a section of the package of FIG. 2A is substantially similar to a corresponding section of the package of FIG. 1, according to some embodiments.

FIG. 2B illustrates a top view of an example configuration of one or more structures of the package of FIG. 2A, according to some embodiments.

FIGS. 3A, 3B, 3C, 3D, 3E, 3F, 3G, 3H, 3I, 3J, 3K, 3L, 3M, 3N, 3O, 3P, 3Q, 3R, and 3S illustrate example processes for formation of the package of FIG. 1, according to some embodiments.

FIGS. 4A, 4B, 4C, 4D, 4E, 4F, 4G, 4H, 4I, and 4J illustrate example processes for formation of the package of FIGS. 2A-2B, according to some embodiments.

FIG. 6 illustrates a computing device or a SoC (System-on-Chip) including one or more of the packages of FIGS. 1-5, according to some embodiments.

DETAILED DESCRIPTION

Figure 1:
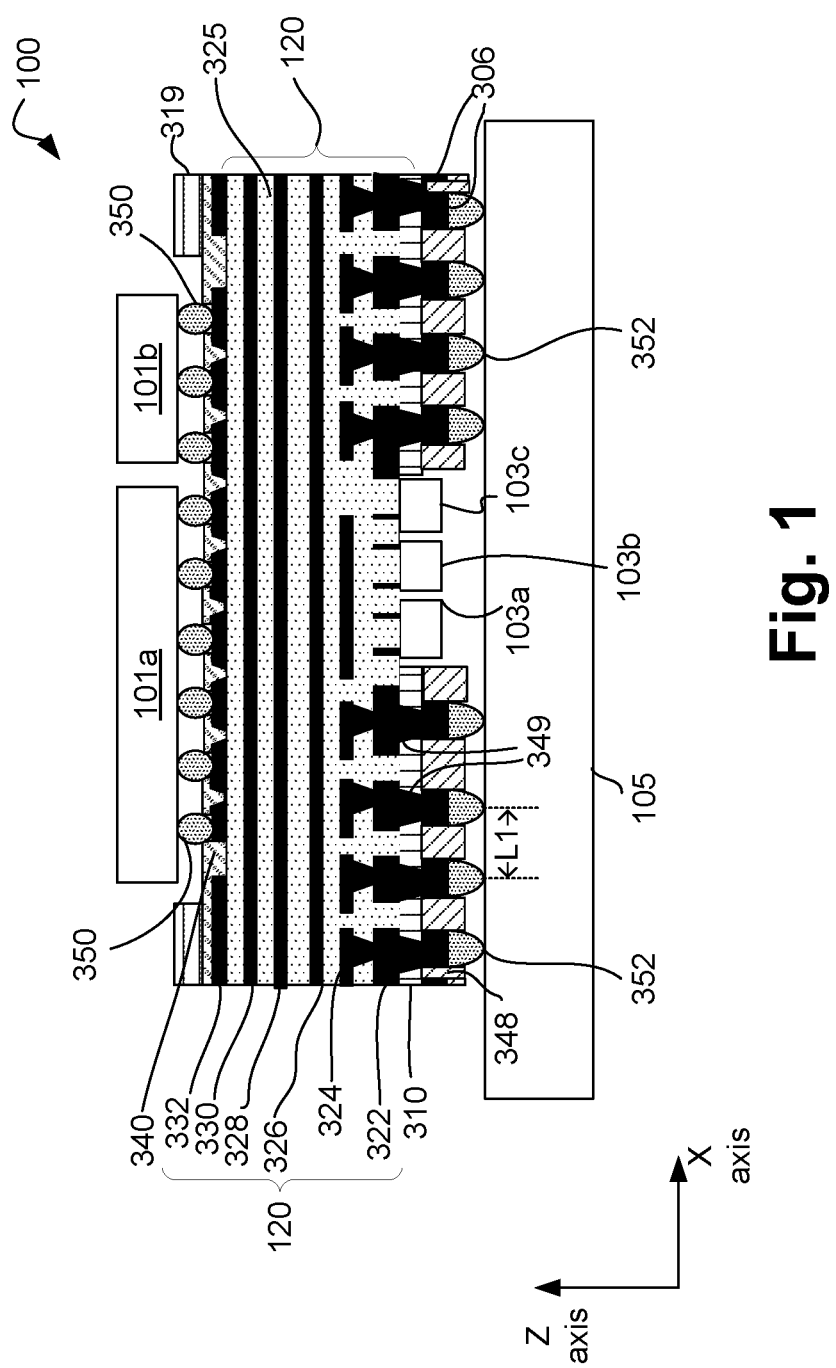
FIG. 1 schematically illustrates a cross-sectional view of a semiconductor package with a relatively small pitch (e.g., pitch L1) for package interconnect structures, and with a recess in a substrate for coupling one or more land side components (LSC), according to some embodiments.

Designing, testing, validating, and/or forming a semiconductor package takes considerable time and resource. In an example, a first semiconductor package may be designed to have interconnects with a relatively small pitch (e.g., a pitch of L1), and the first semiconductor package may be attached to a board with the interconnect pitch L1, where the board may be a High Density Interconnect (HDI) board. However, a HDI board with interconnects having the small pitch of L1 may be costly and may not be always desirable. For example, it may be desired to use a Low Density Interconnect (LDI) board with interconnects that have a relatively large pitch of L2.

Designing, testing, validating, and/or forming a new semiconductor package specifically for the LDI board may take considerable time and resource. So, in some embodiments, the same first semiconductor package design (e.g., with interconnects having the small pitch of L1 suitable for the HDI board) is further suitable for use with the LDI board having the large pitch of L2.

To enable re-use of the design of the first semiconductor package to the LDI board, the design of the first semiconductor package may be reused in a second semiconductor package. For example, to enable attachment of the first semiconductor package to the LDI board, the first semiconductor package design may be integrated as a kernel of the second semiconductor package design. The second semiconductor package may include Redistribution Layers (RDL) and other routing structures to translate or redistribute the smaller pitch L1 of the first semiconductor package to the larger pitch L2 of the LDI board.

Also, as discussed herein, due to the design of the first semiconductor package within the second semiconductor package, a portion of the second semiconductor package may not be used by the first semiconductor package or by the RDL or the other routing structures. This unused portion may be utilized in many ways. Merely as an example, a mechanical structure may be embedded within this portion, e.g., to provide structural rigidity to the second semiconductor package and to improve warpage performance. In another example, the structure may also be used for routing signals between one or more dies of the second semiconductor package and the LDI board.

Thus, various embodiments of this disclosure facilitate the use of the first semiconductor package design with the smaller pitch HDI board, as well as with the larger pitch LDI board. Also, when the first semiconductor package design is used with the larger pitch LDI board, unused space in the package may be occupied by structures that provide mechanical rigidity and strength, and may also optionally provide electrical routing. In some embodiments, one or more land side components may be attached to the first semiconductor package at the smaller pitch L1 when used with the HDI board, or when used with the LDI board. The LSC may be contained within a recess or cavity of the first semiconductor package. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 schematically illustrates a cross-sectional view of a semiconductor package 100 (also referred to as package 100) with a relatively small pitch (e.g., pitch L1) for package interconnect structures 352, and with a recess in a substrate 325 for coupling one or more land side components (LSC) 103a, 103b, 103c, according to some embodiments.

For example, the pitch L1 of the package 100 may be smaller than a pitch L2 of a package 200 discussed herein later with respect to FIG. 2A. In some embodiments, the pitch L1 is within a range of 0.4 mm to 0.5 mm. In some embodiments, the pitch L1 is within a range of 0.3 mm to 0.5 mm. In an example, the pitch L1 is about 0.43 mm, about 0.4 mm, about 0.33 mm, or the like.

In some embodiments, the substrate 325 is a coreless substrate, although in some other examples, the substrate 325 may include a core. In some embodiments, the substrate 325 includes a plurality of interconnect metallization layers (also referred to as interconnect layers) 332, 330, 328, 326, 324, and 322, which are generally referred to as interconnect layers 120 in plural, and an interconnect layer 120 in singular. Although six interconnect layers 120 are illustrated in FIG. 1, there may be higher or lower number of such interconnect layers. The interconnect layers 120 may include conductive material, such as metal (e.g., copper).

In some embodiments, a first side of the substrate 325 (e.g., a land side of the substrate 325) may face a board 105, e.g., a PCB, a motherboard, etc. The substrate 325 may have a second side (e.g., a die side) opposite the first side, and one or more components 101a, 101b may be coupled on the second side of the substrate 325. The components 101a, 101b may be integrated circuit chips or dies, for example, and will be henceforth referred to as dies 101a, 101b without loss of generality. Although two dies 101a, 101b are illustrated to be attached to the substrate 325, any other appropriate number of dies may be attached to the substrate 325.

The dies 101a, 101b may be coupled to the substrate 325 via a plurality of interconnect structures 350. The interconnect structures 350, for example, are bumps, bump pads, metal pillars (e.g., copper pillars), balls formed using metals, alloys, solderable material, solder balls, or the like. The interconnect structures 350, for example, are solder formed using metals, alloys, solderable material, or the like. In some embodiments, solder resist 340 may embed at least a part of the interconnect structures 350.

In some embodiments, the dies 101a, 101b may be electrically coupled to the interconnect layer 322 via the intervening interconnect layers 120 (e.g., 332, 330, 328, 326, and 324), interconnect layer 306, and one or more other interconnect structures such as vias, traces, redistribution layers (RDLs), routing layers, conductive elements, etc.

In some embodiments, the interconnect layer 322 is attached to the board 105 through the interconnect layer 306, a plurality of interconnect structures 352, and a plurality of routing structures 349. The interconnect structures 352, for example, are bumps, bump pads, metal pillars (e.g., copper pillars), balls formed using metals, alloys, solderable material, solder balls, or the like. The interconnect structures 352, for example, are solder formed using metals, alloys, solderable material, or the like. The routing structures 349 may include vias, traces, RDLs, routing layers, conductive elements, etc.

In some embodiments, the routing structures 349 are at least in part embedded in a layer 310, where the layer 310 includes, for example, prepreg material such as pre-impregnated composite fibers, polymer matrix material, epoxy, fiberglass, etc., to provide rigidness to the substrate 325. In some embodiments, the interconnect structures 352 and the routing structures 349 may be at least in part embedded in a layer 348 including solder resist material.

Individual ones of the landside components (LSCs) 103a, 103b, 103c may be, for example, a capacitor, an inductor, a magnetic inductor, a resistor, another passive component, or another appropriate component. Although three LSCs 103 are illustrated, the package 100 may include any other number of LSCs. In some embodiments, the LSCs 103a, 103b may be coupled to the substrate 325 via the interconnect layer 322.

Thus, at least a part of the interconnect layer 322 may be embedded within the substrate 325, and electrically coupled to the board 105 via the interconnect structures 352. Also, at least another part of the interconnect layer 322 may be coupled to the LSCs 103a, 103b, 103c.

In some embodiments, a pitch of interconnection of the interconnect layer 322 is substantially L1, e.g., to couple to the interconnect structures 352, as well as to couple to the LSCs 103a, 103b, 103c. Thus, the interconnect structures 352 are coupled to the interconnect layer 322 at the pitch L1, and the LSCs 103 are also coupled to the interconnect layer 322 at the pitch L1.

At least one or more sections of one or more figures herein are not drawn to the scale. For example, in FIG. 1, the patterning of the interconnect layer 322, where the LSCs 103a, 103c are attached to the interconnect layer 322, are not drawn according to the scale. For example, a section of the interconnect layer 322, to which a pad of a LSC 103 may be attached, may be thicker relative to the other components (e.g., contrary to the illustrations). Similarly, patterning of various other interconnect layers connected to a LSC in various other figures are also not drawn to scale.

In some embodiments, one or more stiffeners 319 may be attached to the die side of the substrate 325, e.g., to provide rigidity and mechanical stability to the package 100 (e.g., to enhance warpage performance of the package 100). The stiffeners 319 may include a mechanically rigid material, such as fiberglass, or another appropriate component.

FIG. 2A schematically illustrates a cross-sectional view of a semiconductor package 200 (also referred to as package 200) with a relatively large pitch (e.g., pitch L2) for package interconnect structures 452, and with a recess in a substrate 425 for coupling one or more LSCs 203a, 203b, 203c, wherein a section of the package 200 of FIG. 2A is substantially similar to a corresponding section of the package 100 of FIG. 1, according to some embodiments. For example, FIG. 2A illustrates a section of the package 200 identified within dotted lines 401, where the section of the package 200 within the dotted lines 401 is also referred to as section 401. In some embodiments, the section 401 of the package 200 is substantially similar to the corresponding section of the package 100 of FIG. 1. Thus, in an example, a design or a structure of the package 100 may be reused in the package 200.

For example, the package 200 includes components 201a, 201b, which may be respectively similar to the components 101a, 101b of the package 100. In an example, the package 200 includes interconnect structures 450 to attach the components 201a, 201b to a substrate 425, where the interconnect structures 450 may be similar to the interconnect structures 350 of the package 100. In an example, the package 200 includes solder resist 440 to embed at least a part of the interconnect structures 450, where the solder resist 440 may be similar to the solder resist 340 of the package 100. The substrate 425 of the package 200 may be at least in part similar to the substrate 325 of the package 100.

Also, the package 200 includes six interconnect layers 220, which may be respectively similar to the interconnect layers 322, 324, 326, 328, 330, 332 (e.g., referred to herein combination as the interconnect layers 120 in FIG. 1) of the package 100 (not all of the six interconnect layers 220 are individually labeled in FIG. 2A). For example, the bottom-most of the six interconnect layers 220 (e.g., one of the six interconnect layers 220 nearest to a board 205) is labeled as layer 422, which may be similar to the interconnect layer 322 of the package 100. The topmost of the six interconnect layers 220 (e.g., one of the six interconnect layers 220 nearest to a components 201a, 201b) is labeled as layer 220a, which may be similar to the interconnect layer 332 of the package 100.

In some embodiments, similar to the interconnect layer 322 of the package 100, the interconnect layer 422 may substantially have a pitch of L1. For example, the LSCs 203 may be coupled to the interconnect layer 422 with the pitch of L1.

The package 200 may be attached to a board 205 through a plurality of interconnect structures 452. The interconnect structures 352, for example, are bumps, bump pads, metal pillars (e.g., copper pillars), balls formed using metals, alloys, solderable material, solder balls, or the like. The interconnect structures 352, for example, are solder formed using metals, alloys, solderable material, or the like.

A pitch of the interconnect structures 452 may be L2. In some embodiments, L2 is different from L1. As an example, L2 may be larger than L1. Thus, unlike the board 105 of the package 100 having the pitch L1 of interconnect pads, the board 205 of the package 200 may have a pitch L2 that is substantially higher than the pitch L1 (although in other examples and although not illustrated in the figures, L2 may be less than L1). In an example, L2 may be higher than 0.6 mm, may be between 0.6 to 0.7 mm, may be about 0.65 mm, and/or the like.

In an example, translation of the pitch L1 of the interconnect layer 422 to the pitch L2 of the interconnect structures 452 may be performed using one or more interconnect layers 461 (e.g., interconnect layers 461a, 461b, 461c, 461d), a plurality of routing structures 449, etc. The routing structures 449 may include vias, traces, RDLs, routing layers, conductive elements, etc. Because the one or more interconnect layers 461 and the plurality of routing structures 449 redistribute or translate the pitch, the one or more interconnect layers 461 and the plurality of routing structures 449 are also referred to herein as RDL, pitch translation layers, pitch translation structures, etc.

The one or more interconnect layers 461 may include interconnect layers 461a, 461b, 461c, 461d, although the package 200 may include any other appropriate number of such interconnect layers. The interconnect layers 461 may include conductive material, e.g., copper, any appropriate metal or metal alloy, etc. Thus, the interconnect layers 461 and the routing structures 449 may translate or redistribute the pitch L1 of the interconnect layer 422 to the pitch L2 of the interconnect structures 452.

In some embodiments, the interconnect structures 452 may be at least in part embedded in a layer 410 including prepreg material, which may include pre-impregnated composite fibers, polymer matrix material, epoxy, fiberglass, etc., e.g., to provide rigidness to the substrate 425. In some embodiments, the interconnect layer 461d and/or the routing structures 449 may be at least in part embedded in a layer 448 including solder resist material.

In some embodiments, the package 200 includes one or more structures 210 including metal or another rigid material. The one or more structures 210 may provide mechanical strength or rigidity to the package 200, e.g., to enhance warpage performance of the package 200. FIG. 2B illustrates a top view of an example configuration of the one or more structures 210 of the package 200 of FIG. 2A, according to some embodiments.

In some embodiments, the structure 210 may be embedded within a portion of the substrate 425. For example, as illustrated in FIGS. 2A-2B, a portion of the substrate 425 may extend laterally beyond an edge of the dies 201a, 102b, and at least a portion of the structure 210 may be formed in at least a section of the portion extending laterally beyond the edge of the dies 201a, 102b. In some embodiments, the one or more structures 210 are disposed on all four sides of the dies 201a, 201b. In some other examples, and although not illustrated in FIG. 2B, the one or more structures 210 may be disposed on one side of the dies 201a, 201b, on two sides of the dies 201a, 201b, or on three sides of the dies 201a, 201b.

Merely as an example, in the top view of FIG. 2B, the die 201a may have a first side, and a second that is perpendicular to the first side, and a third side that is parallel to the first side. The one or more structures 210 may be disposed on at least the first and second sides, may be disposed on at least the first and third sides, or may be disposed on at least the first, second and third sides. Although FIG. 2B illustrates the structure 210 to be a continuous structure formed along the periphery of the dies 201a, 201b, in some examples, the structure 210 may be discontinuous, or may have another appropriate shape and/or location.

In some embodiments, the structure 210 is electrically isolated from the interconnect layers 220, 461, routing structures 449, etc. In some embodiments, the structure 210 is electrically isolated from the dies 201a, 201b. In some embodiments, the structure 210 is electrically isolated from the interconnect layers 220, 461, routing structures 449, and from the dies 201a, 201b. In other embodiments, the structure 210 is electrically coupled to some, but not all of the interconnect layers 220, 461, routing structures 449, and the dies 201a, 201b. In other embodiments, the structure 210 is electrically coupled all of the interconnect layers 220, 461, routing structures 449, and from the dies 201a, 201b.

In some embodiments, the structure 210 includes a plurality of layers of rigid material (e.g., metal). For example, the structure 210 may be a metal moat. Merely as an example, the structure 210 may include a three-dimensional grid or interconnection of layers. For example, in the cross-sectional view of FIG. 2A, horizontal layers 211a, 211b, and vertical layers 212a, 212b are labeled.

In an example, the layer 211a may be coplanar to a top most of the interconnect layers 220, the layer 211b may be coplanar to a bottom most of the interconnect layers 220, and so on. A vertical layer 212a may interconnect the horizontal layers 211a, 211b.

In some embodiments, the package 200 may further include stiffeners 419, which may be similar to the stiffeners 319 of the package 10, e.g., to provide rigidity and mechanical stability to the package. In some other embodiments, as the structure 210 may already provide such rigidity and mechanical stability, the stiffeners 419 may be absent from the package 200. Notably however, one or more features of the package section 401 may be indicative of this section's use within multiple package contexts. For example, in embodiments where the stiffeners 419 may be absent from the package 200, locations to accommodate such stiffeners (e.g., when package section 401 is employed in the context of package 100) may remain evident in the package 200. Other such vestigial features, such as, but not limited to, unused pads or interconnects, may be present within package section 401. Such features would be indicative of package section 401 have been adapted to multiple package contexts.

Referring to FIGS. 1 and 2A, the design of the package 100 (e.g., having a pitch L1) may be reused to cater to a board 205 having a different pitch L2. In an example, the board 105 of the package 100 may be a HDI board (e.g., a Type 4 HDI board) having the pitch L1, and the board 205 of the package 200 may be a LDI board (e.g., a Type 3 LDI board) having the pitch L2. The same design of the package 100 may be reused for any of the HDI board 105 or the LDI board 205. The pitch translation interconnect layers 460 and the routing structures 449 may allow the same design of the package 100 to be reused for the LDI board 205 in the package 200. The LSCs (e.g., LSCs 103, 203) in either of the packages may be coupled using the same pitch L1. This results in savings in time and cost associated with redesigning, retesting and/or revalidating the base package for the LDI board 205.

Furthermore, a space for the LSCs 203 in the package 200 may be larger than a space for the LSCs 103 for the package 100. Thus, for example, larger sized LSCs 203 may be used in the package 200, e.g., compared to the size of the LSCs 103 in the package 100. Furthermore, the recess in the substrate of the packages 100 and 200 allows the LSCs 102, 203 to be forming within the recess, thereby eliminating any need for a recess or a hole within the boards 105, 205. Thus, a Recess in Mother Board (RIMB) or a Hole in Mother Board (HIMB) can be avoided for the packages 100, 200.

FIGS. 3A, 3B, 3C, 3D, 3E, 3F, 3G, 3H, 3I, 3J, 3K, 3L, 3M, 3N, 3O, 3P, 3Q, 3R, and 3S illustrate example processes for formation of the package 100 of FIG. 1, according to some embodiments. For example, FIGS. 3A-3S are cross-sectional views of the package 100 evolving as example operations for formation of the package 100 are performed.

Figure 3A:
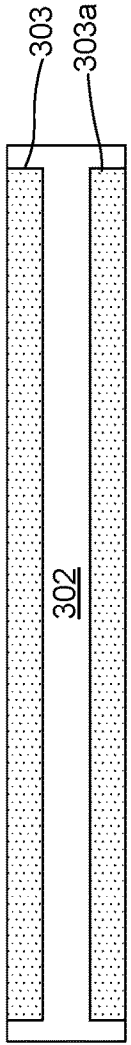

Referring to FIG. 3A, illustrated is a component carrier 302, which may act as a dummy core to build the package 100. Processing may be performed on both sides of the carrier 302, to form two respective instances of the package 100, although in some examples processing may be performed on only one side of the carrier 302. In an example, the carrier 302 may include layers 303 and 303a, such as metal (e.g., copper) on both sides, as illustrated in FIG. 3A. In another example, the layers 303 and 303a may be absent. The layers 303, 303a may be for rigidity and/or better adhesion on adhesive layers, discussed in FIG. 3B.

Figure 3B:
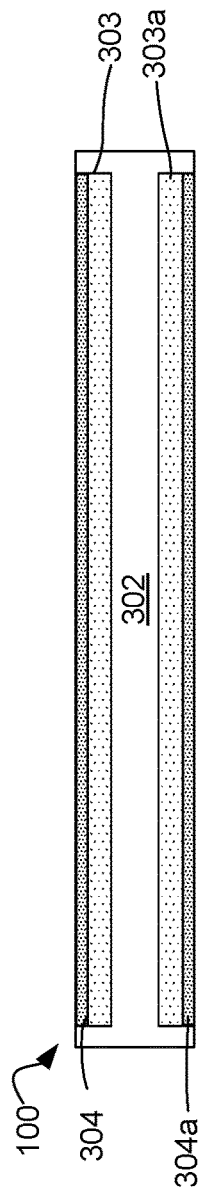
Figure 3C:
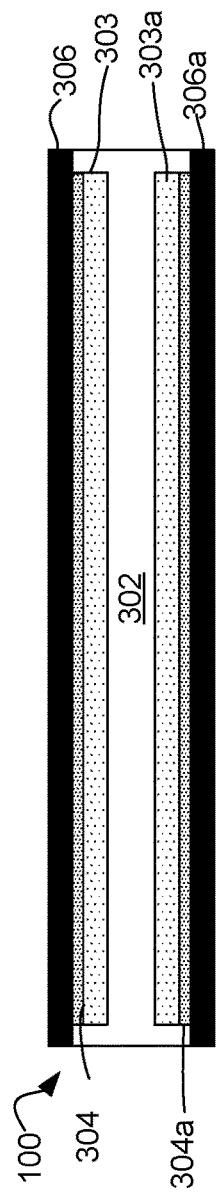
Figure 3D:
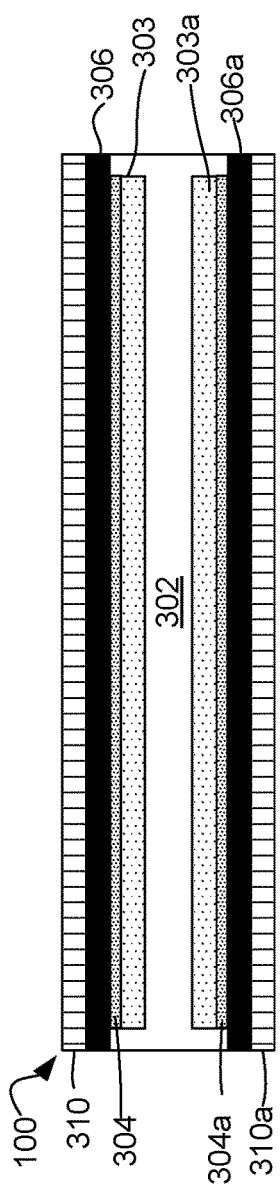

Referring now to FIG. 3B, adhesive layers 304 and 304a may be respectively attached to the two sides of the carrier 302 (e.g., may be attached to the layers 303 and 303a, respectively). Adhesive layers 304 and 304a may have adhesion capability on both sides. Referring now to FIG. 3C, interconnect layers 306, 306a, including conductive material (e.g., metal and/or metal alloy), may be deposited on the adhesive layers 304, 304a, respectively. Referring now to FIG. 3D, layers 310, 310a (e.g., including prepreg lamination, e.g., as discussed with respect to FIG. 1) may be deposited on the interconnect layers 306, 306a, respectively.

Referring now to FIG. 3E, cavities 314, 314a may be respectively formed in the layers 310, 310a, respectively. In an example, laser may be projected on sections of the layers 310, 310a to respectively form the cavities 314, 314a. Referring now to FIG. 3F, the cavities 314, 314a may be filed with sacrificial material 318, 318a, respectively.

Referring now to FIG. 3G, interconnect metallization layers 322, 322a may be deposited on the layers 310, 310a, respectively. In an example, the interconnect layers 322, 322a may include metal such as copper, and two copper foil may be laminated on the layers 310, 310a, respectively, followed by black oxide treatment.

Referring now to FIG. 3H, a plurality of vias 320 (e.g., through vias) may be formed in the interconnect layer 322 and the layer 310, and a plurality of vias 320a (e.g., through vias) may be formed in the interconnect layer 322a and the layer 310a. The vias may be formed using laser drilling, for example.

Referring now to FIG. 3I, the vias 320, 320a may be filed with conductive material (e.g., metal such as copper). Thus, the vias 320 filed with the conductive material may electrically couple the interconnect layers 306, 322, and the vias 320a filed with the conductive material may electrically couple the interconnect layers 306a, 322a.

Referring now to FIG. 3J, the interconnect layer 322 may be patterned to selectively remove sections of the interconnect layer 322, and the interconnect layer 322a may be patterned to selectively remove sections of the interconnect layer 322a. As discussed with respect to FIG. 1, the patterning may be done at a pitch L1.

Referring now to FIG. 3K, a build-up layer of the substrate 325 may be deposited on the interconnect layer 322, and may also fill the patterns of the interconnect layer 322. Similarly, a build-up layer of the substrate 325a may also be formed on the other side of the carrier 302. Merely as an example, Ajinomoto Build-up Film (ABF) or other appropriate substrate film may be used for the build-up layer.

Referring now to FIG. 3L, the substrate 325 may be patterned (e.g., to form vias) and filed with conductive material, another interconnect layer 324 may be formed over the substrate 325, and the interconnect layer 324 may be patterned. Similar process may also be performed on the other side of the carrier 302. For example, the vias in the substrate 325 may be laser drilled, and filed with conductive material. In an example, the interconnect layer 324 may be formed by semi-additive copper plating process. An electroless plating process, or an electrolytic copper plating process may be used. The vias in the substrate 325 may be routing structures to electrically connect interconnect layers 322 and 324.

Figure 3M:
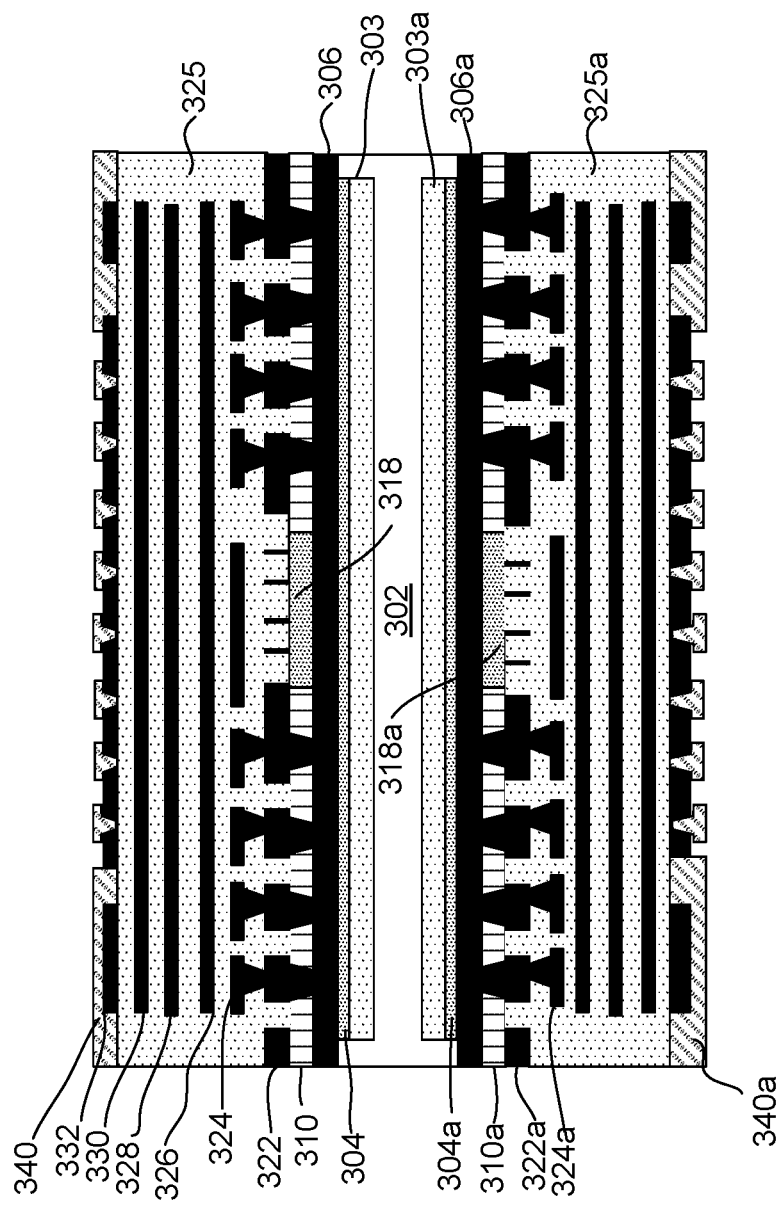

The operations discussed with respect to FIGS. 3K-3L may be iteratively repeated, e.g., to form a plurality of interconnect layers 324, 326, 328, 330, 332, and corresponding layers of the substrate 325, as illustrated in FIG. 3M. Similar processing may also be performed on the other side of the carrier 302 as well. The patterning and routing of the one or more of the interconnect layers 324, 326, 328, 330, 332 are not illustrated in FIG. 3M for purposes of illustrative clarity.

Also illustrated in FIG. 3M are solder resist (SR) layers 340, 340a respectively deposited on the substrate 325, 325a. For example, the SR layers may be laminated on the respective substrates. The SR layers 325, 325a may be patterned to form openings in the SR layers.

Figure 3N:
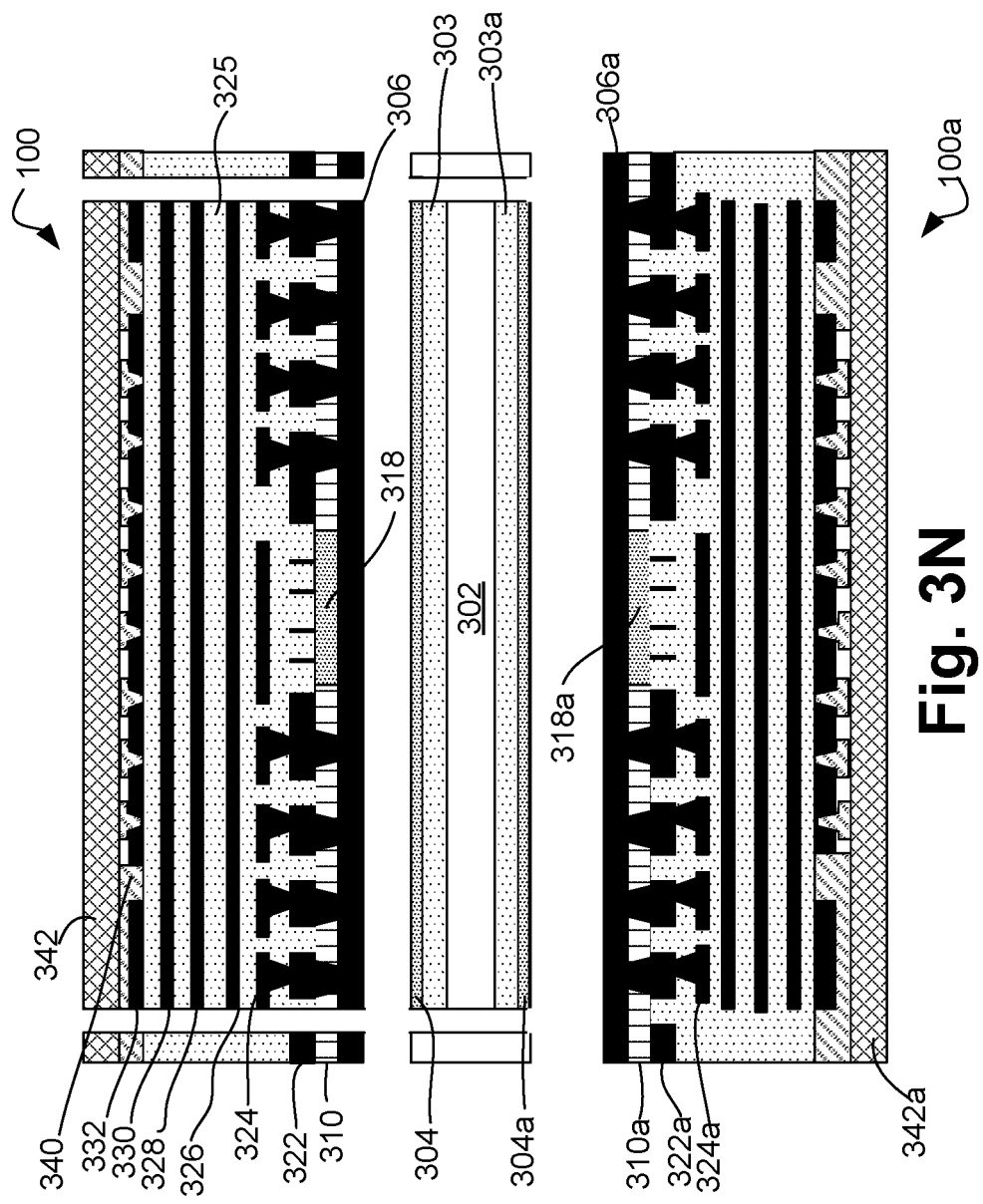

Referring now to FIG. 3N, layers 342, 342a are attached to the substrates 325, 325a, respectively, and then the two partially formed packages are de-bonded from the carrier 302 and singulated. The layers 342, 342a may, at least temporarily, provide mechanical rigidity to the packages. The layers 342, 342a may include any rigid or semi-rigid film that provides mechanical stability, e.g., Polyethylene terephthalate (PET), a polymer, a resin film, a glass fiber film, etc. Any appropriate process may be adapted for de-bonding the packages, based on a type of the adhesive film used, e.g., thermal de-bonding, chemical de-bonding, mechanical de-bonding, laser de-bonding, etc. Subsequent figures illustrate processing of one of the two packages (e.g., a top one of the two packages, which includes the substrate 325).

Figure 3O:
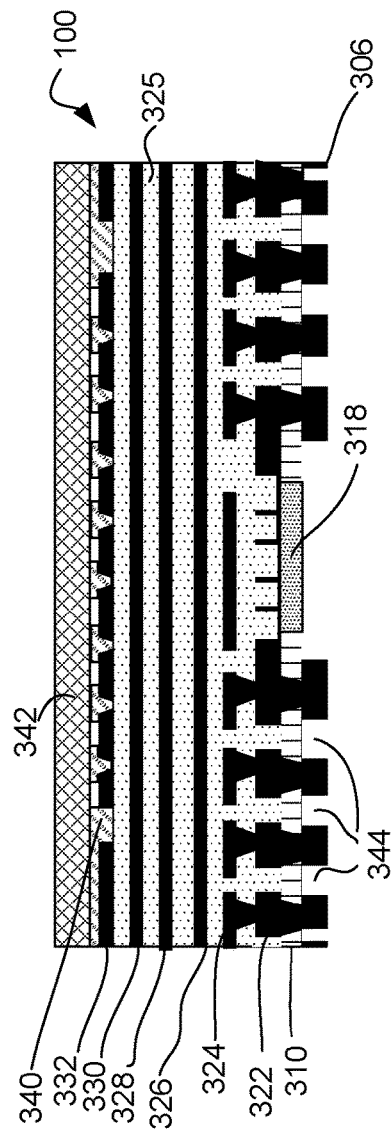
Figure 3P:
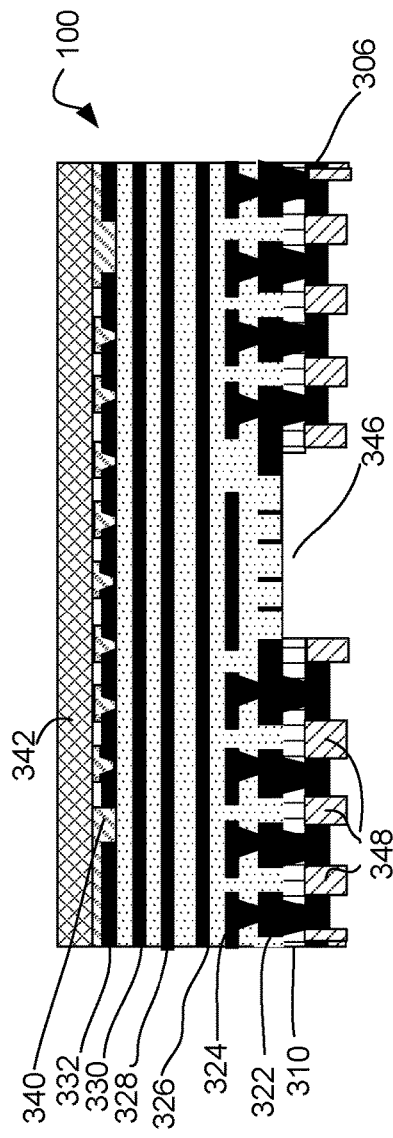

Referring now to FIG. 3O, the interconnect layer 306 is patterned using a subtractive patterning process. Referring now to FIG. 3P, the sacrificial material 318 may be removed to form a cavity or recess 346 within the substrate 325. Also, solder resist material layer 348 may be applied to sections of the interconnect layer 306. For example, solder resist material may be laminated, selectively exposed, and patterned to form the solder resist material layer 348.

Figure 3Q:
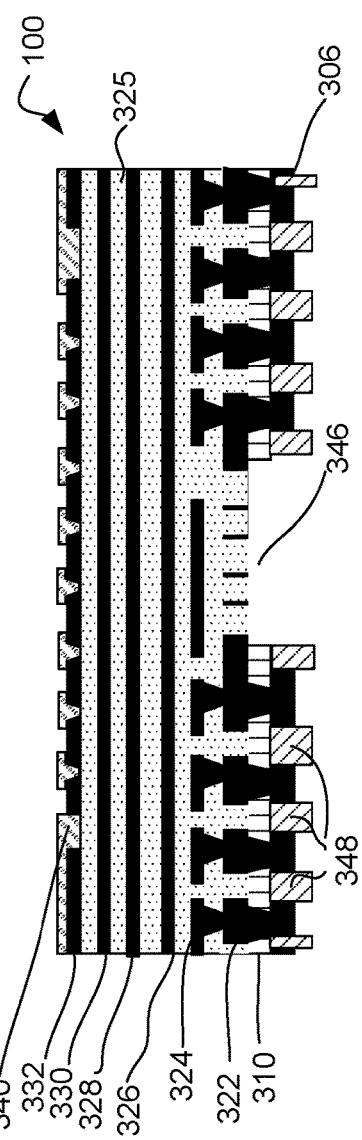

Referring now to FIG. 3Q, layer 342 (e.g., which may include a PET film) may be removed. Referring now to FIG. 3R, dies 101a, 101b may be now attached to the substrate 325 (e.g., to the interconnect layer 322) using interconnect structures 350. Also, the components 103a, 103b, 103c may be placed within the recess 346, and attached to the land side of the substrate 325, e.g., attached to sections of the interconnect layer 322 that are exposed through the recess 346.

Merely as an example, a component 103 may be attached to the land side of the substrate 325 using solder paste. The solder paste may be disposed within the recess of the substrate 325, e.g., using a solder paste jetting technology. Solder paste jetting technology may achieve non-contact paste transfer with controlled paste volume, and may deposit solder paste within the recess or cavity. For example, solder paste jetting technology may deposit solder paste by jetting above the pad on the substrate 325 within the recess. For example, solder paste (not illustrated in FIG. 3R) may be jetted on the pads (not illustrated in FIG. 3R) of the patterned interconnect layer 322, and subsequently the components 103 may be attached to the pads via the solder paste.

Referring now to FIG. 3S, the package 100 may be attached to the board 105 using interconnect structures 352. As discussed with respect to FIG. 1, the interconnect structures 352 have a pitch of L1, which may also be the pitch with which the components 103 are attached to the interconnect layer 322. The package 100 of FIG. 3S is the package 100 of FIG. 1.

FIGS. 4A, 4B, 4C, 4D, 4E, 4F, 4G, 4H, 4I, and 4J illustrate example processes for formation of the package 200 of FIGS. 2A-2B, according to some embodiments. For example, FIGS. 4A-4J are cross-sectional views of the package 200 evolving as example operations for formation of the package 200 are performed.

Figure 4A:
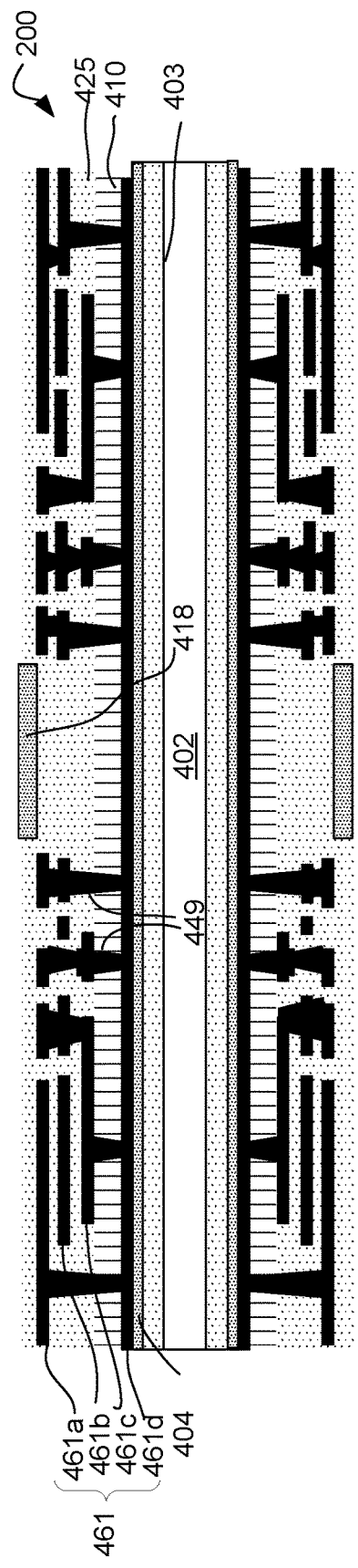

Referring to FIG. 4A, illustrated is a component carrier 402, which may act as a dummy core to build the package (e.g., similar to the component carrier 302 of FIG. 3A). Processing may be performed on both sides of the carrier 402, to form two respective instances of the package 200, although in some examples processing may be performed on only one side of the carrier 402.

Although various figures illustrate processes associated with formation of two respective instances of the same package, processes associated with formation of the package 200 on merely one side of the carrier 402 is discussed herein in details and also labeled in various figures.

Similar to FIGS. 3A-3B, in FIG. 4A the carrier 402 may include layer 403, which may include metal (e.g., copper) (although in some examples, the layer 403 may be absent). The layer 403 may be for rigidity and/or better adhesion of adhesive layers. An adhesive layer 404 may be attached to the carrier 402 (e.g., may be attached to the layer 403). Adhesive layer 404 may have adhesion capability on both sides.

RDL layers including one or more interconnect layers 461 (e.g., the interconnect layers 461a, 461b, 461c, 461d, as discussed with respect to FIGS. 2A) and the plurality of routing structures 449 are formed on the adhesive layer 404. In some embodiments, layer 410 including prepreg material may also be formed over the interconnect layer 461d (e.g., similar to the formation discussed with respect to FIGS. 3C-3D). RDL including interconnect layers 461a, 461b, 461c, 461d and routing structures that selectively connect the interconnect layers 461a, 461b, 461c, 461d may also be formed, as illustrated in FIG. 4A. Furthermore, sacrificial material layer 418 may be formed on a substrate 425 (e.g., similar to the discussion with respect to FIG. 3H).

Figure 4B:
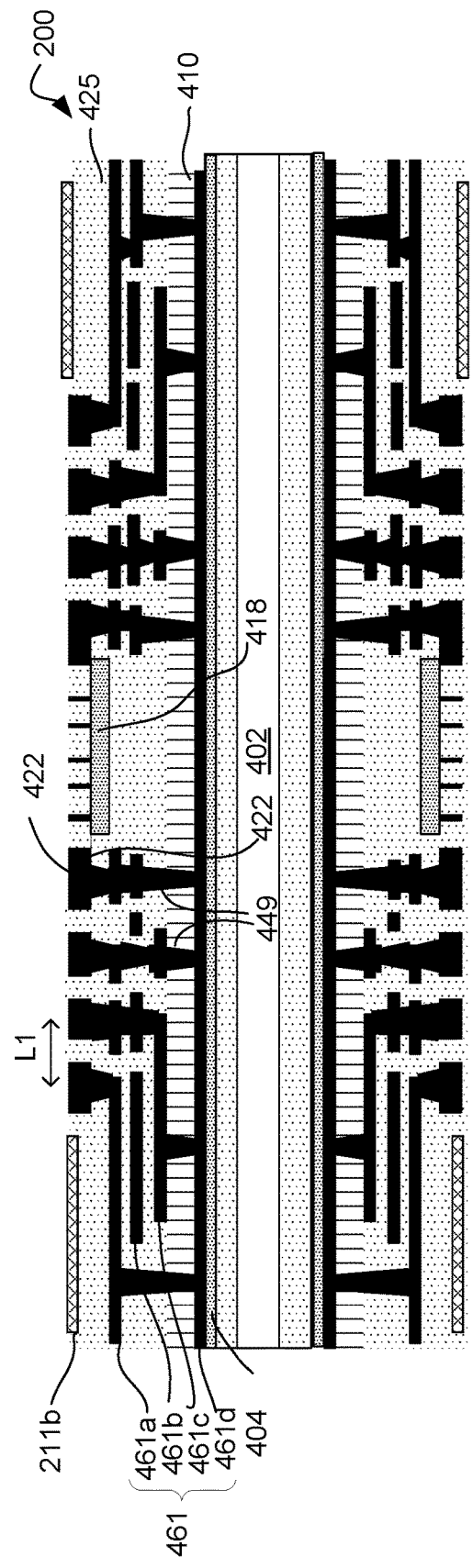

Referring now to FIG. 4B, the interconnect layer 422 (e.g., including conductive material, such as metal, metal alloy, etc.), may be deposited on the substrate 425. Furthermore, the bottom most layer 211b of the structure 210 may also be formed. The interconnect layer 422 and the layer 211b may be at least in part simultaneously formed (e.g., by laminating a copper foil on the substrate 425, and patterning the copper foil to respectively form the interconnect layer 422 and the layer 211b). The interconnect layer 422 and the layer 211b may be coplanar. As illustrated, the interconnect layer 422 may also be patterned. As discussed with respect to FIG. 2A, the interconnect layer 422 may be patterned to have a pitch of L1.

Figure 4C:
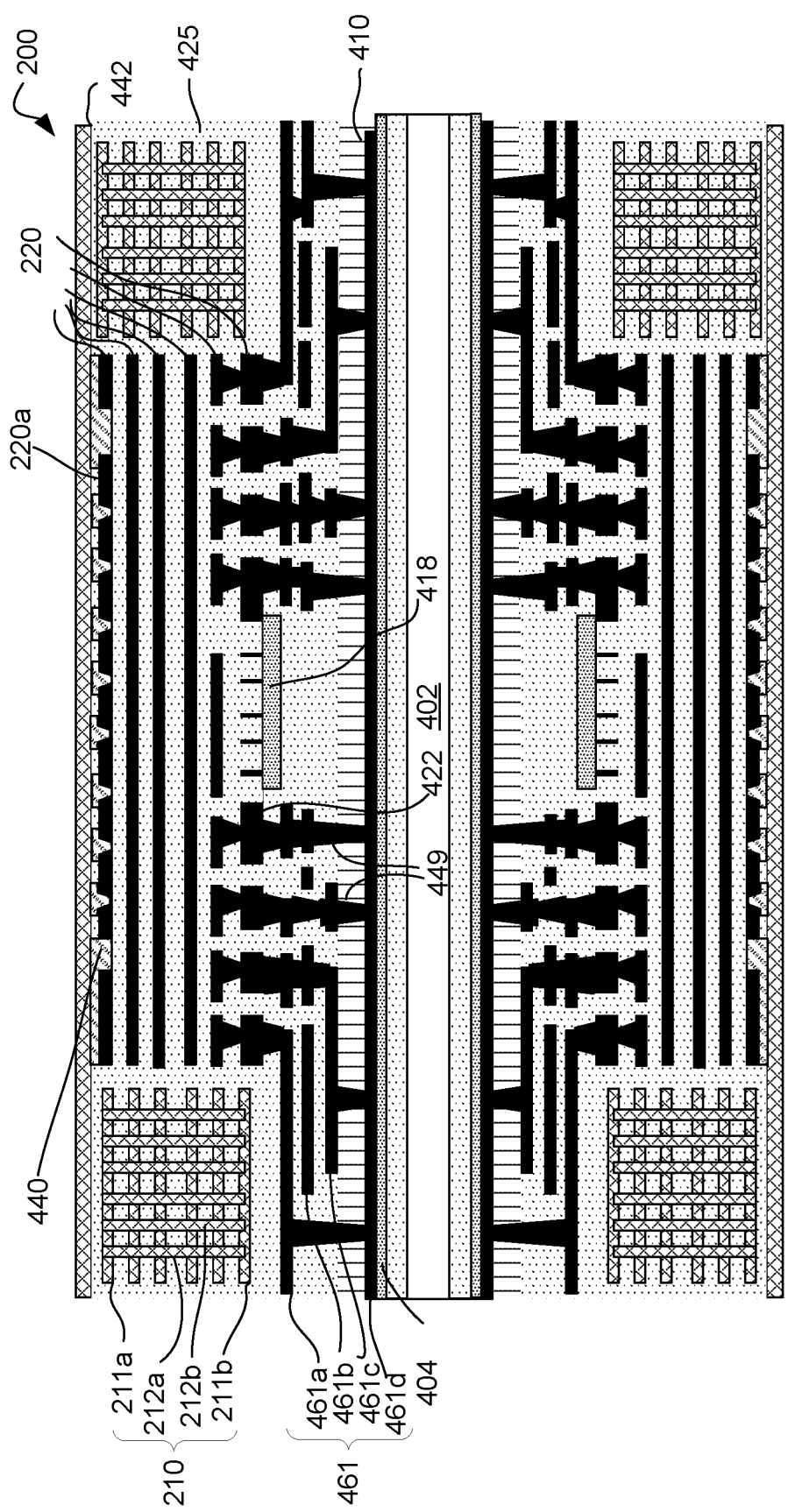

The formation and patterning of the interconnect layer 422 and the layer 211b of the structure 210 may be repeated multiple times, to result in the package illustrated in FIG. 4C. Thus, the package 200 in FIG. 4C has a plurality of interconnect layers, collectively referred to using label 220 (as also illustrated in FIG. 2A). Also in FIG. 4C, a top most interconnect layer 220a of interconnect layers 220 (e.g., the interconnect layer farthest from the carrier 402) may be patterned, a layer 440 including solder resist material may be deposited on the patterned interconnect layer 220a, and the layer 440 may be patterned to expose the patterned interconnect layer 220a.

Subsequently, a layer 442 may be attached to the substrate 425, as also illustrated in FIG. 4C. The layer 442 may, at least temporarily, provide mechanical rigidity to the substrate 425. The layer 442 may include any rigid or semi-rigid film that provides mechanical stability, e.g., PET, a polymer, a resin film, a glass fiber film, etc.

Figure 4D:
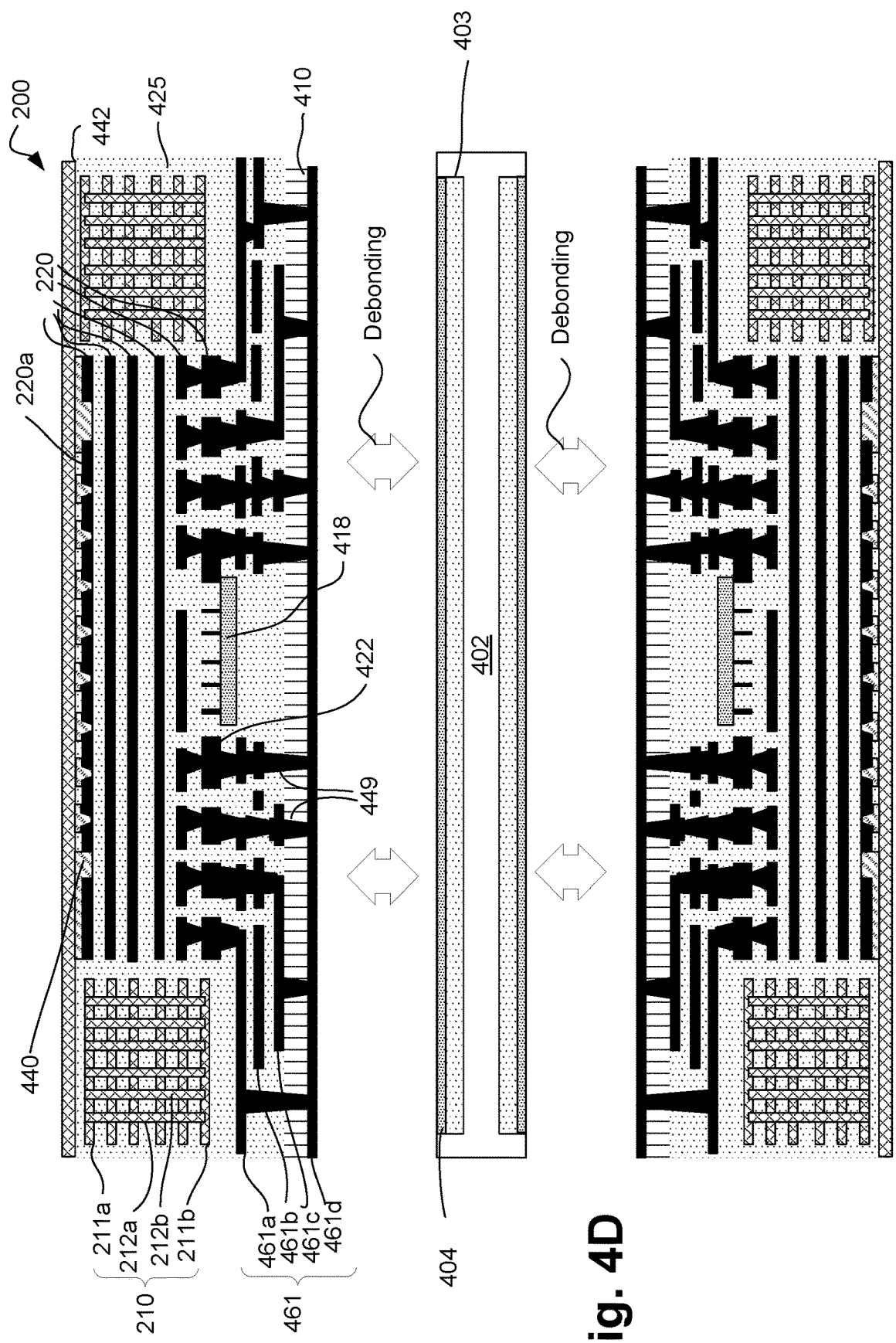

Referring now to FIG. 4D, the package 200 formed on a first side and another package formed on a second side of the carrier 402 may be de-bonded from the carrier 402. Any appropriate process may be adapted for de-bonding the two packages, based on a type of the adhesive films used, e.g., thermal de-bonding, chemical de-bonding, mechanical de-bonding, laser de-bonding, etc. Subsequent figures illustrate processing of the package 200 of the two packages (e.g., a top one of the two packages, which may include the substrate 325).

Figure 4E:
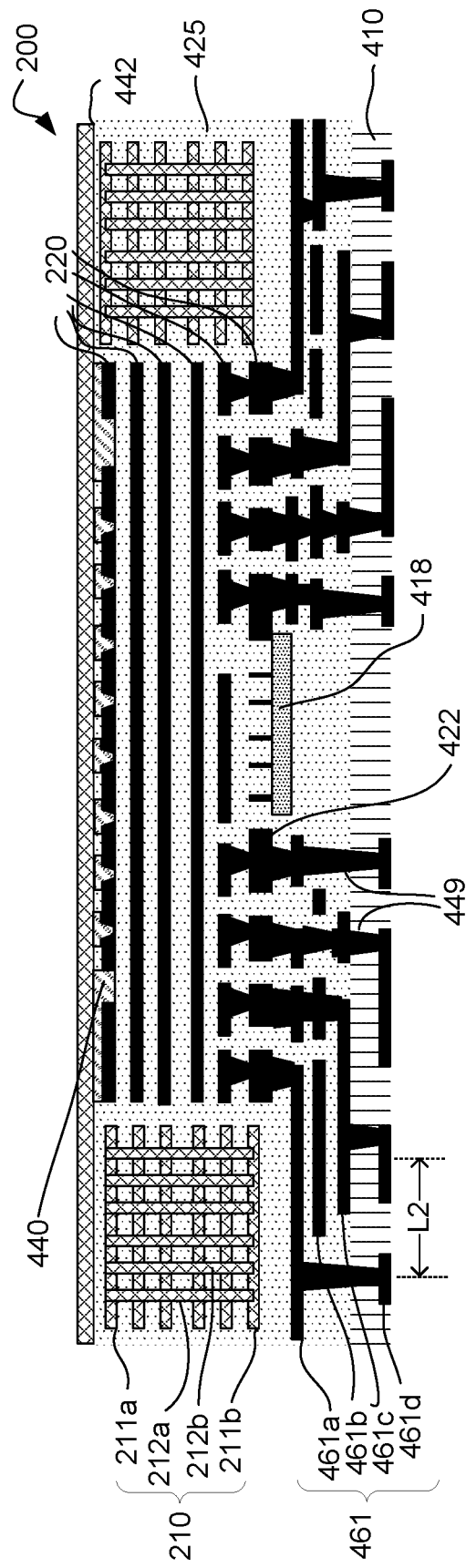

Referring now to FIG. 4E, the interconnect layer 461d may be subtractively patterned, e.g., such that the patterned interconnect layer 461d has a pitch L2. Referring now to FIG. 4F, sections of the layer 410 and the substrate 425 may be selectively removed to form a cavity or recess 446. For example, laser may be used to remove sections of the layer 410 and the substrate 425. In some embodiments, sections of the layer 410 and the substrate 425 underneath the sacrificial material layer 418 may be removed. Referring now to FIG. 4G, the sacrificial material layer 418 may be removed (e.g., the sacrificial material layer 418 may be stripped) through the recess 446, e.g., to extend the recess 446 and to expose the patterned interconnect layer 422 through the recess 446.

Figure 4H:
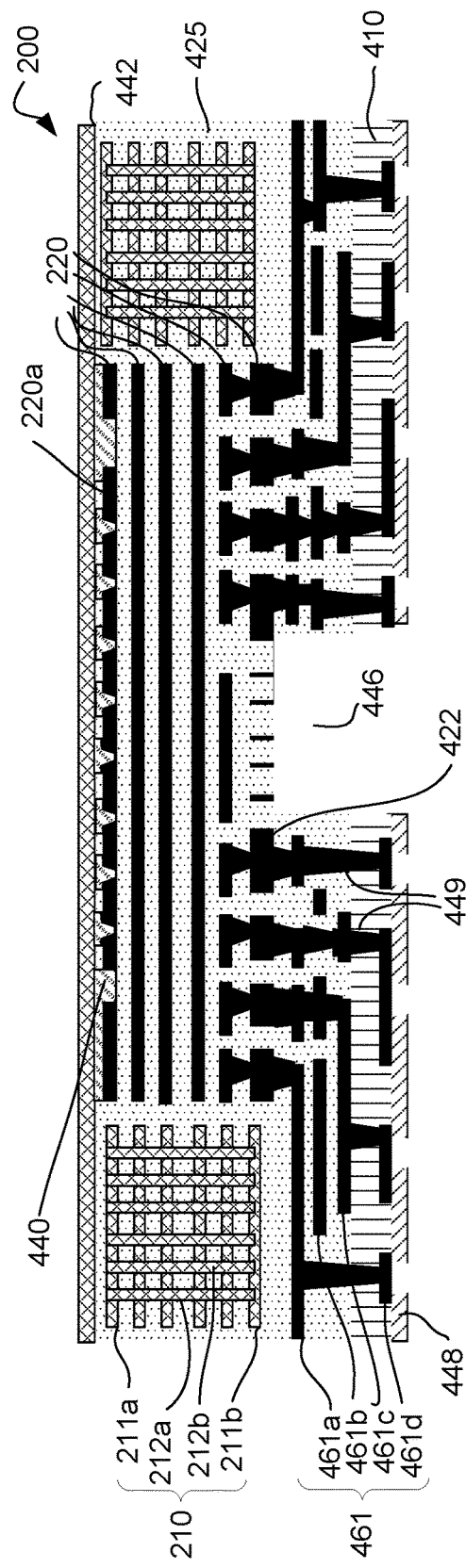
Figure 4I:
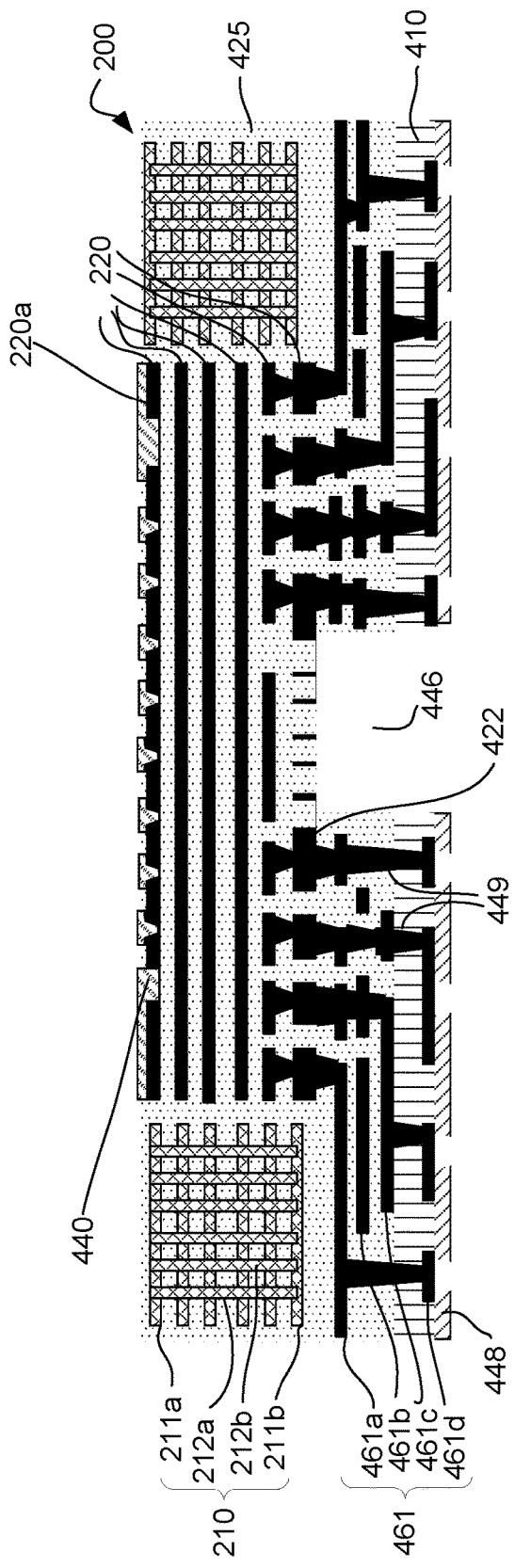

Referring now to FIG. 4H, solder resist layer 448 may be formed (e.g., by laminating a solder resist film) on the patterned interconnect layer 461d. Subsequently, the solder resist layer 448 may be subtractively patterned to expose the patterned interconnect layer 461d. Referring now to FIG. 4I, the layer 442 (e.g., which was added before the de-bonding process) may now be removed.

Figure 4J:
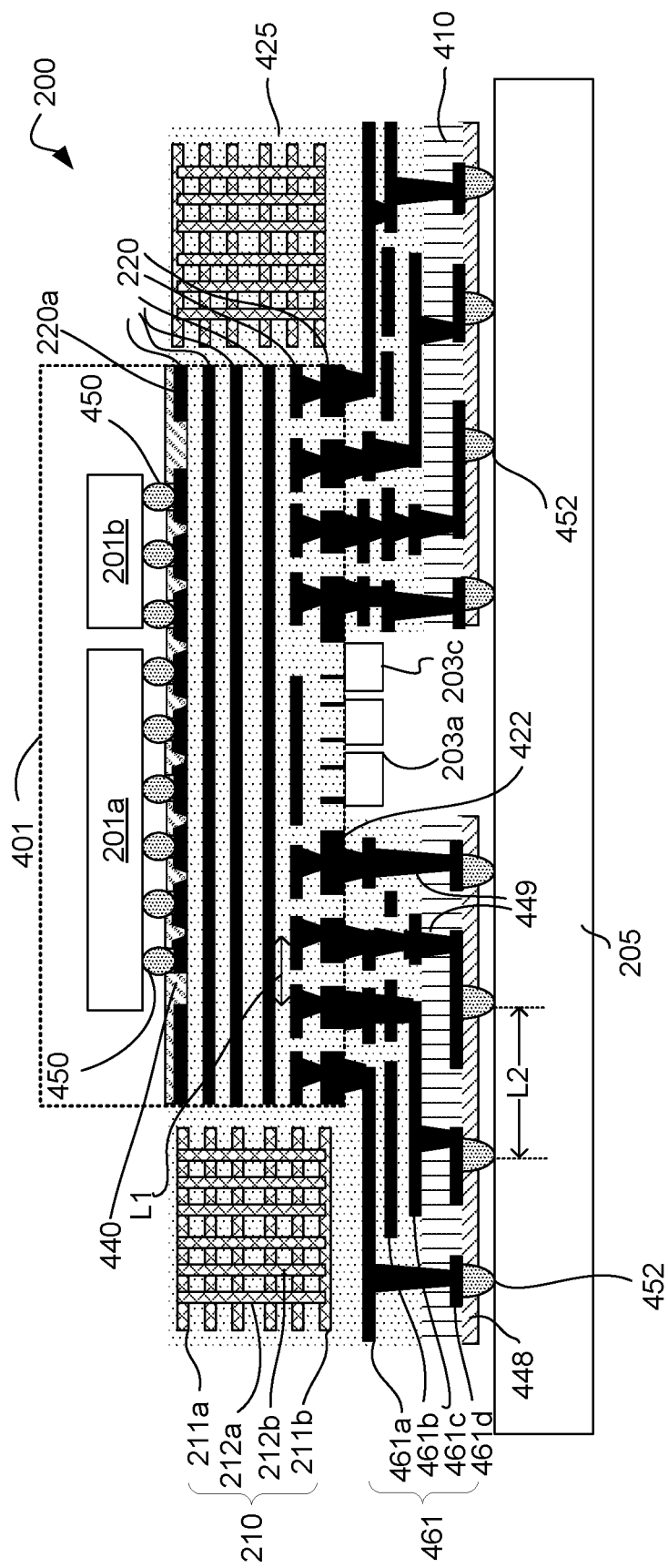

Referring now to FIG. 4J, the dies 201a, 201b may be attached to the package 200 (e.g., to the patterned interconnect layer 220a) using interconnect structures 450. The LSCs 203a, 203b, 203c may be attached to the interconnect layer 422 through the recess 446. Also, the board 205 may be attached to the package 200 (e.g., to the patterned interconnect layer 461d) using interconnect structures 452. The package 200 illustrated in FIG. 4J is the package illustrated in FIGS. 2A-2B.

Referring again to FIG. 2A, the structure 210, albeit providing mechanical strength and rigidity to the substrate 325, may not provide electrical routing in the package 200. For example, the structure 210 may be electrically isolated form the dies 201a, 201b, and/or from the various interconnect layers 210, 416, etc. However, in some other embodiments, the structure 210 (or a structure that is similar to the structure 210) may be configured to conduct electricity, to provide routing or connectivity to one or more components of the package, as illustrated in FIG. 5.

Figure 5:
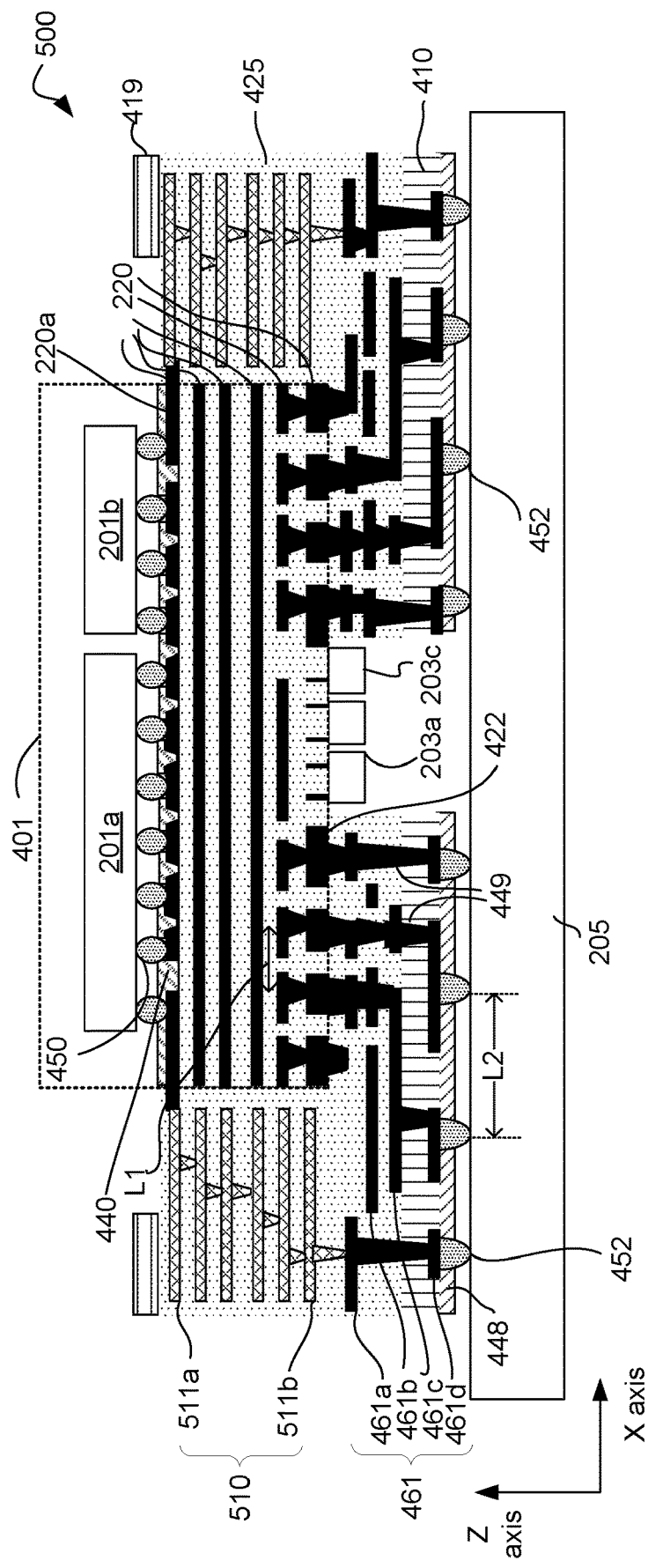
FIG. 5 schematically illustrates a cross-sectional view of a semiconductor package with a relatively high pitch (e.g., pitch L2) for package interconnect structures, and with a recess in a substrate for coupling one or more LSCs, wherein a section of the package of FIG. 5 is substantially similar to a corresponding section of the package of FIG. 1, and wherein a structure of the package of FIG. 5 provides mechanical rigidity, support, and electrical connectivity to the package, according to some embodiments.

FIG. 5 schematically illustrates a cross-sectional view of a semiconductor package 500 (also referred to as package 500) with a relatively high pitch (e.g., pitch L2) for package interconnect structures 452, and with a recess in a substrate 425 for coupling one or more LSCs 203a, 203b, 203c, wherein a section of the package 500 of FIG. 5 is substantially similar to a corresponding section of the package 100 of FIG. 1, and wherein a structure 510 of the package 500 provides mechanical rigidity, support, and electrical connectivity to the package 500, according to some embodiments.

The package 500 is at least in part similar to the package 200 of FIGS. 2A-2B, and hence, various components in the packages 200 and 500 are labelled using same labels. However, the package 200 includes the structure 210, while the package 500 includes the structure 510, where the structures 210 and 510 are different. For example, the structure 510 includes conductive interconnect layers 511a, 511b, etc. (which may be similar to the layers 211a, 211b of the package 200). The interconnect layers 511a, 511b may, for example, couple the die 201a (or the die 201b) to one or more package interconnect structures 452. In an example, the interconnect layers 511a, 511b may be electrically isolated from one or more of the interconnect layers 461, 220 (although in some other examples, the interconnect layers 511a, 511b may be electrically coupled to one or more of the interconnect layers 461, 220). Thus, the structure 510 may use otherwise unused area of the substrate 425 to provide mechanical stability and rigidity to the package 500 (e.g., to enhance warpage performance of the package 500), as well as couple the dies 201a and/or 201b to the board 205.

FIG. 6 illustrates a computing device or a SoC (System-on-Chip) 2100 including one or more of the packages 100, 200, or 500 of FIGS. 1-5, according to some embodiments. It is pointed out that those elements of FIG. 6 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an TOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 may include one or more of the packages 100, 200, or 500 of FIGS. 1-5. For example, one or more of the packages 100, 200, or 500 may include any appropriate component of the computing device 2100, such as, but not limited to, the processor 2110, a memory of the memory subsystem 2160, a graphic processing unit (GPU) or a graphic processor, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A method of forming an integrated circuit (IC) package, the method comprising:
  forming a substrate comprising a sacrificial material, wherein the forming comprises:
    forming a first interconnect layer having a first pitch and embedded within the substrate, adjacent to the sacrificial material; and
    forming a second interconnect layer with a second pitch, smaller than the first pitch, over a first side of the sacrificial material and over the first interconnect layer;
  removing the sacrificial material to form a recess within the substrate, the recess exposing at least a part of the second interconnect layer, wherein removing the sacrificial material comprises exposing the sacrificial material by removing a first portion of the substrate exposed by the forming of the first interconnect layer; and
  attaching one or more components within the recess, and to the second interconnect layer.

2. The method of claim 1, wherein forming the first interconnect layer comprises:
  forming a conductive material layer over a carrier;
  applying a prepreg material layer over a first side of the conductive material layer;
  separating the substrate from the carrier after forming the second interconnect layer to expose a second side of the conductive material layer; and
  subtractively patterning the conductive material layer into features having the first pitch, wherein the patterning also removes a portion of the conductive material layer from over a second side of the sacrificial material.

3. The method of claim 2, wherein exposing the sacrificial material comprises laser drilling into the first portion of the substrate exposed by the patterning of the conductive material layer into the features of the first interconnect layer having the first pitch.

4. The method of claim 3, wherein drilling into the first portion of the substrate comprises removing a portion of the prepreg material layer.

5. The method of claim 2, further comprising:
  forming an opening by drilling into a second portion of the substrate; and
  at least partially filling the opening with the sacrificial material.

6. The method of claim 5, wherein forming the opening in the second portion of the substrate comprises laser drilling into the prepreg material layer, and wherein the laser drilling is stopped by the conductive material layer.

7. The method of claim 5, wherein forming the second interconnect layer further comprises:
  forming a second conductive material layer over a first side of the sacrificial material and over a first side of the prepreg material layer;
  exposing the conductive material layer adjacent to the sacrificial material by subtractively patterning via openings through the second conductive material layer and through the prepreg material layer;
  forming vias by depositing conductive material into the via openings; and
  subtractively patterning the second conductive material layer into features having the second pitch.

8. The method of claim 1, further comprising forming one or more pitch translation layers between the first interconnect layer and the second interconnect layer, the pitch translation layers translating the first pitch of the first interconnect layer to the second pitch of the second interconnect layer.

9. The method of claim 8, wherein removing the sacrificial material comprises exposing the sacrificial material by removing a first portion of the substrate surrounded by the pitch translation layers, the first portion exposed by the forming of the first interconnect layer.

10. The method of claim 1, further comprising:
  attaching a plurality of first interconnect structures having the first pitch to the first interconnect layer.

11. The method of claim 10, wherein attaching the first interconnect structures comprises attaching a plurality of first solder features to the first interconnect layer.

12. The method of claim 1, further comprising attaching a die to the substrate, the die coupled to the second interconnect layer via one or more intervening interconnect layers.

13. The method of claim 12, wherein attaching the die further comprises attaching a plurality of second solder features to the second interconnect layer.

14. The method of claim 10, further comprising iteratively forming two or more intervening interconnect layers, wherein each iteration comprises:

forming a build-up dielectric material over the second interconnect layer;
patterning feature openings in the build-up dielectric material; and
depositing conductive material in the feature openings.

* * * * *